(12) United States Patent
Keshtbod

(10) Patent No.: US 8,363,457 B2
(45) Date of Patent: Jan. 29, 2013

(54) MAGNETIC MEMORY SENSING CIRCUIT

(75) Inventor: Parviz Keshtbod, Los Altos Hills, CA (US)

(73) Assignee: Avalanche Technology, Inc., Fremont, CA (US)

(*) Notice: Subject to any disclaimer, the term of this patent is extended or adjusted under 35 U.S.C. 154(b) by 421 days.

(21) Appl. No.: 12/125,866

(22) Filed: May 22, 2008

(65) Prior Publication Data

US 2009/0154229 A1 Jun. 18, 2009

Related U.S. Application Data

(63) Continuation-in-part of application No. 12/040,801, filed on Feb. 29, 2008, and a continuation-in-part of application No. 11/674,124, filed on Feb. 12, 2007, now Pat. No. 8,084,835, and a continuation-in-part of application No. 11/678,515, filed on Feb. 23, 2007, now Pat. No. 8,058,696, and a continuation-in-part of application No. 11/739,648, filed on Apr. 24, 2007, now Pat. No. 8,183,652, and a continuation-in-part of application No. 11/740,861, filed on Apr. 26, 2007, and a continuation-in-part of application No. 11/776,692, filed on Jul. 12, 2007, now Pat. No. 8,063,459, and a continuation-in-part of application No. 11/860,467, filed on Sep. 24, 2007, now Pat. No. 8,018,011, and a continuation-in-part of application No. 11/866,830, filed on Oct. 3, 2007, and a continuation-in-part of application No. 11/932,940, filed on Oct. 31, 2007, now Pat. No. 7,732,881.

(60) Provisional application No. 60/853,115, filed on Oct. 20, 2006, provisional application No. 60/777,012, filed on Feb. 25, 2006, provisional application No. 60/863,812, filed on Nov. 1, 2006.

(51) Int. Cl.
*G11C 11/00* (2006.01)

(52) U.S. Cl. ............ 365/158; 365/171; 365/210.14
(58) Field of Classification Search ............... 365/158, 365/171, 173, 205, 210.1, 210.14
See application file for complete search history.

(56) References Cited

U.S. PATENT DOCUMENTS 3,665,264 A 5/1972 Yukami et al.
(Continued)

FOREIGN PATENT DOCUMENTS

JP 2002197851 A 7/2002
JP 2004006774 A 1/2004
(Continued)

OTHER PUBLICATIONS

Daly et al., "Analog BiCMOS Design Practices and Pitfalls," 2000, CRC Press, Chapters 2 and 3.*

(Continued)

*Primary Examiner* — Tuan T Nguyen
*Assistant Examiner* — Lance Reidlinger
(74) *Attorney, Agent, or Firm* — Maryam Imam; IPxLaw Group LLP

(57) ABSTRACT

A sensing circuit includes a sense amplifier circuit having a first and second nodes through which a magnetic memory element is sensed. A first current source is coupled to the first node a second current source is coupled to the second node. A reference magnetic memory element has a resistance associated therewith and is coupled to the first node, the reference magnetic memory element receives current from the first current source. At least one memory element, having a resistance associated therewith, is coupled to the second node and receives current from the second current source. Current from the first current source and current from the second current source are substantially the same. The logic state of the at least one memory element is sensed by a comparison of the resistance of the at least one memory element to the resistance of the reference magnetic memory element.

8 Claims, 7 Drawing Sheets

U.S. PATENT DOCUMENTS

| | | | |
|---|---|---|---|
| 5,060,098 A | 10/1991 | Gotoh et al. | |
| 6,072,718 A | 6/2000 | Abraham et al. | |
| 6,169,689 B1 | 1/2001 | Naji | |
| 6,365,419 B1 | 4/2002 | Durlam et al. | |
| 6,504,752 B2 * | 1/2003 | Ito | 365/158 |
| 6,587,371 B1 * | 7/2003 | Hidaka | 365/173 |
| 6,642,579 B2 | 11/2003 | Hung | |
| 6,642,595 B1 | 11/2003 | Hung et al. | |
| 6,670,660 B2 | 12/2003 | Hosotani | |
| 6,697,294 B1 | 2/2004 | Qi et al. | |
| 6,724,585 B2 | 4/2004 | Hayashi | |
| 6,743,642 B2 | 6/2004 | Costrini et al. | |
| 6,759,263 B2 | 7/2004 | Ying et al. | |
| 6,783,999 B1 | 8/2004 | Lee | |
| 6,821,907 B2 | 11/2004 | Hwang et al. | |
| 6,893,893 B2 | 5/2005 | Nallan et al. | |
| 6,905,578 B1 | 6/2005 | Moslehi et al. | |
| 6,920,063 B2 | 7/2005 | Huai et al. | |
| 6,933,155 B2 | 8/2005 | Albert et al. | |
| 6,964,928 B2 | 11/2005 | Ying et al. | |
| 6,984,561 B2 | 1/2006 | Herner et al. | |
| 6,984,585 B2 | 1/2006 | Ying et al. | |
| 6,985,385 B2 | 1/2006 | Nguyen et al. | |
| 6,995,422 B2 | 2/2006 | Herner et al. | |
| 7,002,781 B2 | 2/2006 | Sugawara | |
| 7,005,730 B2 | 2/2006 | Verma et al. | |
| 7,009,877 B1 | 3/2006 | Huai et al. | |
| 7,018,878 B2 | 3/2006 | Vyvoda et al. | |
| 7,023,725 B2 | 4/2006 | Saito et al. | |
| 7,023,739 B2 | 4/2006 | Chen et al. | |
| 7,057,921 B2 | 6/2006 | Valet | |
| 7,106,624 B2 | 9/2006 | Huai et al. | |
| 7,109,539 B2 | 9/2006 | Lu | |
| 7,120,049 B2 | 10/2006 | Nakamura et al. | |
| 7,183,130 B2 | 2/2007 | Nuetzel et al. | |
| 7,272,034 B1 * | 9/2007 | Chen et al. | 365/158 |
| 2002/0048128 A1 | 4/2002 | Kamiguchi et al. | |
| 2003/0108776 A1 | 6/2003 | Chang et al. | |
| 2003/0123200 A1 | 7/2003 | Nagasaka et al. | |
| 2003/0128483 A1 | 7/2003 | Kamijo | |
| 2003/0202407 A1 * | 10/2003 | Hidaka | 365/200 |
| 2003/0232223 A1 | 12/2003 | Leddy et al. | |
| 2004/0042128 A1 | 3/2004 | Slaughter et al. | |
| 2004/0130936 A1 | 7/2004 | Nguyen et al. | |
| 2004/0159832 A1 | 8/2004 | Hack | |
| 2004/0170055 A1 | 9/2004 | Albert et al. | |
| 2004/0201070 A1 | 10/2004 | Deak | |
| 2005/0045913 A1 | 3/2005 | Nguyen et al. | |
| 2005/0063222 A1 | 3/2005 | Huai et al. | |
| 2005/0105325 A1 | 5/2005 | Haneda et al. | |
| 2005/0167657 A1 | 8/2005 | Nickel et al. | |
| 2005/0195532 A1 | 9/2005 | Sugiyama et al. | |
| 2005/0201020 A1 | 9/2005 | Fuke et al. | |
| 2005/0207219 A1 | 9/2005 | Lee et al. | |
| 2005/0254287 A1 | 11/2005 | Valet et al. | |
| 2006/0017081 A1 | 1/2006 | Sun et al. | |
| 2006/0081953 A1 | 4/2006 | Nguyen et al. | |
| 2006/0083056 A1 | 4/2006 | Daughton et al. | |
| 2006/0092689 A1 * | 5/2006 | Braun et al. | 365/158 |
| 2006/0104110 A1 | 5/2006 | Sun et al. | |
| 2006/0109591 A1 | 5/2006 | Ranjan et al. | |
| 2006/0114620 A1 | 6/2006 | Sbiaa et al. | |
| 2006/0141640 A1 | 6/2006 | Huai et al. | |
| 2006/0171198 A1 | 8/2006 | Saito et al. | |
| 2006/0187703 A1 | 8/2006 | Mizuguchi et al. | |
| 2006/0192237 A1 | 8/2006 | Huai | |
| 2006/0227465 A1 | 10/2006 | Inokuchi et al. | |
| 2006/0239066 A1 | 10/2006 | Liaw | |
| 2006/0268604 A1 | 11/2006 | Onogi et al. | |
| 2007/0007609 A1 | 1/2007 | Saito et al. | |
| 2007/0164336 A1 | 7/2007 | Saito et al. | |
| 2007/0201265 A1 | 8/2007 | Ranjan | |
| 2007/0253245 A1 | 11/2007 | Ranjan | |
| 2008/0043519 A1 | 2/2008 | Kitagawa et al. | |
| 2008/0094886 A1 | 4/2008 | Ranjan | |
| 2008/0164548 A1 | 7/2008 | Ranjan | |
| 2008/0180991 A1 | 7/2008 | Wang | |
| 2008/0191251 A1 | 8/2008 | Ranjan | |
| 2008/0225585 A1 | 9/2008 | Ranjan | |
| 2008/0246104 A1 | 10/2008 | Ranjan | |
| 2008/0293165 A1 | 11/2008 | Ranjan | |
| 2009/0646501 | 2/2009 | Ranjan | |
| 2009/0109739 A1 | 4/2009 | Ranjan | |

FOREIGN PATENT DOCUMENTS

| | | |
|---|---|---|
| JP | 2006157027 A | 6/2006 |
| JP | 2006269530 A | 10/2006 |
| JP | 2006277864 A | 10/2006 |
| JP | 2006295198 | 10/2006 |
| JP | 2007073971 | 3/2007 |
| JP | 2007096105 A | 4/2007 |
| JP | 2007142364 A | 6/2007 |

OTHER PUBLICATIONS

Durlam et al., "Nonvolatile RAM Based on Magnetic Tunnel Junction Elements," ISSCC Digest of Technical Papers, TA7.3, Feb. 2000, pp. 96-97, 130-131, 410-411.*

Tsunekawa, K. et al., Huge Magnetoresistance and Low Junction Resistance in Magnetic Tunnel Junctions With Crystalline MgO Barrier, IEEE Transactions on Magnetics, vol. 42, No. 2, Feb. 2006, pp. 103-107.

Boslet, M., IBM to reveal chip advance, Nanotechnology Boosts Products' Speed, Efficiency, Mercury News, 3 pp.

Sharma, M. et al., Inversion of Spin Polarization and Tunneling Magnetoresistance in Spin-Dependent Tunneling Junctions, Physical Review Letters, vol. 82, No. 3, Jan. 18, 1999, pp. 616-619.

Guhr, I.L. et al., Magnetization reversal in exchange biased nanocap arrays, J. Phys. D: Appl. Phys. 40 (2007), pp. 3005-3010.

Ohsawa, Y., Magnetoresistance and Current-Driven Resistance Change Measurements in NiFe Film With a Nanoconstriction, IEEE Transactions on Magnetics, vol. 42, No. 10, Oct. 2006, pp. 2615-2617.

Mendes, M.J., Manipulation of Magnetization by Spin Polarized Current in GMR Devices, Rice University, Nanostructures and Nanotechnology I, Fall 2005, 12 pp.

Lee, J. et al., Nano Spin Transistor, 33 pp.

Braganca, P.M. et al., Reducing the critical current for short-pulse spin-transfer switching of nanomagnets, Appl. Phys. Lett. 87, 112507 (2005), 3 pp.

Chen, S-P et al., Spin Accumulation from the Spin Hall Effect Studied Using the Effective Mean-Free-Path Model, IEEE Transactions on Magnetics, vol. 42, No. 10, Oct. 2006, pp. 2667-2669.

Zheng, Y.K. et al., Spin Flop Switching of the Guided Synthetic Antiferromagnet MRAM, IEEE Transactions on Magnetics, vol. 42, No. 10, Oct. 2006, pp. 2742-2744.

Joly, L. et al., Spin Motion of Electrons Upon Reflecting From Ferromagnetic Surfaces, IEEE Transactions on Magnetics, vol. 42, No. 10, Oct. 2006, pp. 2645-2648.

Zhu, X. et al., Spin Torque and Field-Driven Perpendicular MRAM Designs Scalable to Multi-Gb/Chip Capacity, IEEE Transactions on Magnetics, vol. 42, No. 10, Oct. 2006, pp. 2739-2741.

Albert, F.J. et al., Spin-polarized current switching of a Co thin film nanomagnet, Appl. Phys. Lett., vol. 77, No. 23, Dec. 4, 2000, pp. 3809-3811.

Zutic, I. et al., Spintronics: Fundamentals and applications, Reviews of Modern Physics, vol. 76, Apr. 2004, pp. 323-410.

Jin, W. et al., Spin-Wave Excitations in Nanopillars With Perpendicular Polarizers, IEEE Transactions on Magnetics, vol. 42, No. 10, Oct. 2006, pp. 2682-2684.

Shimomura, N. et al., Switching Current Fluctuation and Repeatability for MRAM With Propeller-Shape MTJ, IEEE Transactions on Magnetics, vol. 42, No. 10, Oct. 2006, pp. 2757-2759.

Apalkov, D. et al., Temperature Dependence of Spin Transfer Switching in Nanosecond Regime, IEEE Transactions on Magnetics, vol. 42, No. 10, Oct. 2006, pp. 2685-2687.

Kumar, S.B. et al., The Effect of Spreading Resistance on the Magnetoresistance of Current-Perpendicular-to-Plane Spin Valves With Patterned Layers, IEEE Transactions on Magnetics, vol. 42, No. 10, Oct. 2006, pp. 3788-3790.

Serpico, C. et al., Thermal Stability in Uniaxial Nanomagnets Driven by Spin-Polarized Currents, IEEE Transactions on Magnetics, vol. 42, No. 10, Oct. 2006, pp. 2679-2681.

Daibou, T. et al., Tunnel Magnetoresistance Effect in CoFeB/MgO/CoxFeSi and Co2MnSi Tunnel Junctions, IEEE Transactions on Magnetics, vol. 42, No. 10, Oct. 2006, pp. 2655-2657.

Stine, B.E. et al., The Physical and Electrical Effects of Metal-Fill Patterning Practices for Oxide Chemical-Mechanical Polishing Processes, IEEE Transactions on Magnetics, vol. 45, No. 3, Mar. 1998, pp. 665-679.

Lee, J.W. et al., A Planarization Model in Chemical Mechanical Polishing of Silicon Oxide Using High Selective CeO2 Slurry, Samsung Electronics, 1 p.

Nguyen, V.H. et al., Hybrid CMP process for copper and ultra low-k materials integration, 2 pp.

Zhang, J. et al., Automated Process Control of Within-Wafer and Wafer-to-Wafer Uniformity in Oxide CMP, CMP-MIC Mar. 2002, 6 pp.

Karuppiah, L. et al., Overview of CMP Process Control Strategies, Applied Materials, TFG Division, Sunnyvale, CA, 10 pp.

Wijekoon, K. et al., Minimization of Metal Loss during Chemical Mechanical Planerization of Copper-Oxide and Copper-Low k Damascene Structures, CMP-MIC Mar. 2002, 4 pp.

Healey, J., Current Technical Trends: Dual Damascene & Low-k Dielectrics, Threshold Systems, 2002, 6 pp.

Lai, J-Y et al., Evolution of Copper-Oxide Damascene Structures in Chemical Mechanical Polishing, J. Electrochem. Soc., 149 (1), 2002, pp. G41-G50.

Chen, L., Breakthrough technology for CMP, Semiconductor Fabtech—24th Ed., pp. 137-141.

Araswat, EE311/Cu Interconnect, Stanford University, 18 pp.

Chang, R.Z. et al., Modeling the electrical effects of metal dishing due to CMP for on-chip interconnect optimization, University of California Postprints, 2004, Paper 52, 9 pp.

Wolf, P.J., Overview of Dual Damascene Cu/Low-k Interconnect, International Sematech, Aug. 14, 2003, 21 pp.

Buehler, M., CMP Challenges for 32nm, Semicon West 2007, Jul. 2007, 21 pp.

Lai, J-Y, Mechanics, Mechanisms, and Modeling of the Chemical Mechanical Polishing Process, MIT, Feb. 2001, 314 pp.

Wallace, R.M., New Devices and Materials for 32nm and Beyond, Semicon West 2007, 15 pp.

Technology backgrounder: High-k gate oxides, IC Knowledge 2002, 3 pp.

Hoover, C., Enabling Materials for Contact Metallization, Advanced Processes for Advanced Devices, Jul. 2007, 16 pp.

Stokbro, K., Nanoelectronics modeling platform, Atomisitx Inc., 12 pp.

Arghavani, R., Technologies to Enable High-k/Metal Gate Implementation, Semicon West 2007, Jul. 17, 2007, 20 pp.

The Microscopic Twelve Point Probe, Capres A/S, 1 p.

Petersen, C.L., The Four-Point Probe, Thesis at the Technical University of Denmark, Feb. 1999, 110 pp.

SPM-CIPTech, APRES A/S, 1 p.

SPC-CIPTech (Ver. 3) Technical Specifications (rev. Jan. 2006), 4 pp.

Karpan, V.M. et al., Graphite and graphene as perfect spin filters, Feb. 1, 2007, 5 pp.

Cherian, J.G., Quantum Electrodynamics in Graphene, Kutztown University of PA, Physics REU 2006, Univ. of Washington, 13 pp.

Parkin, S., Magnetic Race-Track Memory: Current Induced Domain Wall Motion!, IBM Corporation, 2005, 60 pp.

Hajto, J. et al., Quantized Electron Transport in Amorphous-Silicon Memory Structures, Phys. Rev. Lett., vol. 66, No. 14, Apr. 8, 1991, pp. 1918-1921.

Rossel, C. et al., Electrical current distribution across a metal-insulator-metal structure during bistable switching, J. Appl. Phys., vol. 90, No. 6, Sep. 15, 2001, pp. 2892-2898.

Yuasa, S. et al., Characterization of growth and crystallization processes in CoFeB/MgO/CoFeB magnetic tunnel junction structure by reflective high-energy electron diffraction, Appl. Phys. Lett. 87, 242503 (2005), 3 pp.

Hayakawa, J. et al., Dependence of Giant Tunnel Magnetoresistance of Sputtered CoFeB/MgO/CoFeB Magnetic Tunnel Junctions on MgO Barrier Thickness and Annealing Temperature, JJAP, vol. 44, No. 19, 2005, pp. L587-L589.

Lammers, D., MRAM debut cues memory transition, Jul. 10, 2006, 1 p.

Edwards, D.M., et al., Theory of spin current in magnetic nanopillars for zero-field microwave generation, J. Phys.: Condens. Matter 19 (2007) 165210, 8 pp.

Economikos, L. et al., STI Planarization Using Fixed Abrasive Technology, Feb. 2, 2002, 1 p.

Cu Damascene Process, 6 pp.

Parkin, S., The Spin on Electronics!, Jan. 29, 2008, 1 p.

Barnas, J. et al., Current-induced switching in spin-valve structures, phys. stat. sol. (b) 244, No. 7, pp. 2304-2310.

Carpentieri, M. et al., Micromagnetic Investigation of Precession Dynamics in Magnetic Nanopillars, IEEE Transactions on Magnetics, vol. 43, No. 6, Jun. 2007, pp. 2935-2937.

He, J. et al., Switching speed distribution of spin-torque-induced magnetic reversal, J. Appl. Phys. 101, 09A501 (2007), 3 pp.

Persson, J. et al., Phase-locked spin torque oscillators: Impact of device variability and time delay, J. Appl. Phys. 101, 09A503 (2007), 3 pp.

Kim, W.J. et al., Effect of ac on current-induced domain wall motion, J. Appl. Phys. 101, 09A504 (2007), 3 pp.

Serpico, C. et al., Power spectrum of current-induced magnetization dynamics in uniaxial nanomagnets, J. Appl. Phys. 101, 09A507 (2007), 3 pp.

Finocchio, G. et al., Magnetization dynamics in CoFe/AlO/Permalloy and CoFe/MgO/Permalloy magnetic tunnel junctions, J. Appl. Phys. 101, 09A508 (2007), 3 pp.

Zhou, Y. et al., Intrinisic phase shift between a spin torque oscillator and an alternating current, J. Appl. Phys. 101, 09A510 (2007), 3 pp.

Consolo, G. et al., Influence of the Oersted field in the dynamics of spin-transfer microwave oscillators, J. Appl. Phys. 101, 09C108 (2007), 3 pp.

Devolder, T. et al., Spin transfer oscillators emitting microwave in zero applied magnetic field, J. Appl. Phys. 101, 063916 (2007), 5 pp.

Maat, S. et al., Magnetotransport propeties and spin-torque effects in current perpendicular to the plane spin valves with Co-Fe-Al magnetic layers, J. Appl. Phys. 101, 093905 (2007), 6 pp.

Jalil, M.B.A. et al, Layer thickness and angular dependence of spin transfer torque in ferromagnetic trilayers, J. Appl. Phys. 101, 124314 (2007), 4 pp.

Mizushima, K. et al., Analytical expression of output power spectra of spin-transfer nano-oscillators, Journal of Magnetism and Magnetic Materials 316 (2007) c960-c962.

Meier, G. et al., Current-induced domain-wall motion in permalloy semi rings, Journal of Magnetism and Magnetic Materials 316 (2007) c966-c968.

Slonczewski, J.C. et al., Theory of voltage-driven current and torque in magnetic tunnel junctions, Journal of Magnetism and Magnetic Materials 310 (2007) 169-175.

Consolo, G. et al., Spin-torque switching in Py/Cu/Py and Py/Cu/CoPt spin-valve nanopillars, Journal of Magnetism and Magnetic Materials 316 (2007) 492-495.

Houssameddine, D. et al., Spin-torque oscillator using a perpendicular polarizer and a planar free layer, Nature Materials, vol. 6, Jun. 2007, pp. 447-453.

Kent, A., A nanomagnet oscillator, Nature Materials, vol. 6, Jun. 2007, pp. 399-400.

Boulle, O. et al., Shaped angular dependence of the spin-transfer torque and microwave generation without magnetic field, Nature Physics, vol. 3, Jul. 2007, pp. 492-497.

Pribiag, V.S. et al., Magnetic vortex oscillator driven by d.c. spin-polarized current, Nature Physics, vol. 3, Jul. 2007, pp. 498-503.

Vanhaverbeke, A. et al., Simple model of current-induced spin torque in domain walls, Physical Review B 75, 024411 (2007), 5 pp.

Devolder, T. et al., Distribution of the magnetization reversal duration in subnanosecond spin-transfer switching, Physical Review B 75, 064402 (2007), 5 pp.

Pareek, T.P., Spin-orbit-induced torque in a collinear spin valve: A possible route to design fast magnetic memory, Physical Review B 75, 115308 (2007), 6 pp.

Pufall, M.R. et al., Low-field current-hysteretic oscillations in spin-transfer nanocontacts, Physical Review B 75, 140404 (R) (2007), 4 pp.

Berger, L., Relation between damping, current-induced torques, and wall resistance for domain walls in magnetic nanowires, Physical Review B 75, 174401 (2007), 5 pp.

Yang, S. et al., Spin-transfer-torque-driven domain-wall dynamics in Permalloy nanowires, Physical Review B 75, 220403(R) (2007), 4 pp.

Wei, Z. et al., Changing Exchange Bias in Spin Valves with an Electric Current, PRL 98, 116603 (2007), 4 pp.

Hayakawa, J. et al., Effect of high annealing temperature on giant tunnel magnetoresistance ratio of CoFeB/MgO/CoFeB magnetic tunnel junctions, Appl. Phys. Lett. 89, 232510 (2006), 3 pp.

Lee, Y.M. et al., Giant tunnel magnetoresistance and high annealing stability in CoFeB/MgO/CoFeB magnetic tunnel junctions with synthetic pinned layer, Appl. Phys. Lett. 89, 042506 (2006), 3 pp.

Yang, T. et al., Current-induced vortex-vortex switching in a nanopillar comprising two Co nano-rings, Appl. Phys. Lett. 90, 092505 (2007), 3 pp.

Xi, H. et al., Spin waves excited by dc currents injected into single ferromagnetic thin films, Phys. Rev. B 75, 174411 (2007), 8 pp.

Consolo, G. et al., Magnetization dynamics in nanocontact current controlled oscillators, Phys. Rev. B 75, 214428 (2007), 6 pp.

SpinAps Agenda, Abstracts, Mar. 17-19, 2006.

Tsoi, M., et al, Magnetic domain wall motion triggered by an electric current, App. Phys. Letters, vol. 83, No. 13, Sep. 29, 2003, 2617-2619.

Thiaville, A., et al., Micromagnetic understanding of current-driven domain wall motion in patterned nanowires, Europhys. Lett 69 (6), Mar. 15, 2005, pp. 990-996.

Shibata, J., et al., Current-induced magnetic vortex motion by spin-transfer torque, Physical Review B 73, 020403(R) (2006), 4 pp.

Yamaguchi, A., et al., Reduction of threshold current density for current-driven domain wall motion by shape control, 16 pp.

Kimura, T., et al., Spin-current-assisted domain-wall depinning in a submicron magnetic wire, J. App. Phys., vol. 94, No. 12, Dec. 15, 2003, pp. 7947-7949.

Grollier, J., et al., Switching a spin-valve back and forth by current-induced domain wall motion, 4 pp.

Grollier, J., et al., Switching the magnetic configuration of a spin valve by current-induced domain wall motion, J. App. Phys., vol. 92, No. 8, Oct. 15, 2002, pp. 4825-4827.

Gomez, R.D., et al., An approach to Wearable Magnetic Random Access Memory, ECE Dept., University of Maryland, 12 pp.

Hajto, J., et al., Quantized Electron Transport in Amorphous-Silicon Memory Structures, Physical Review Letters, vol. 66, No. 14, Apr. 8, 1991, pp. 1918-1921.

Rossel, C., et al., Electrical current distribution across a metal-insulator-metal structure during bistable switching, J. Appl. Phys., vol. 90, No. 6, Sep. 15, 2001, pp. 2892-2898.

DeBrosse, J., Circuit Considerations for Spin-Switched MRAM Devices, IBM Microelectronics, May 14, 2004, 15 pp.

Maffitt, T.M., et al., Design considerations for MRAM, IBM J. Res. & Devl., vol. 50, No. 1, Jan. 2006, pp. 25-39.

Gallagher, W. J. et al., Development of the magnetic tunnel junction MRAM at IBM: From first junctions to a 16-Mb MRAM demonstrator chip, IBM J. Res. & Devl., vol. 50, No. 1, Jan. 2006, pp. 5-23A.

Jiang, X., et al., Highly efficient room-temperature tunnel spin injector using CoFe/MgO(001), IBM J. Res. & Dev., vol. 50, No. 1, Jan. 2006, pp. 111-120.

Parkin, Stuart, Magnetic Race-Track Memory: Current Induced Domain Wall Motion!, IBM Research, 2006, 60 pp.

Abraham, D.W., Rapid-turnaround characterization methods for MRAM development, IBM J. Res. & Dev., vol. 50, No. 1, Jan. 2006, pp. 55-67.

Worledge, D.C., Single-domain model for toggle MRAM, IBM J. Res. & Dev., vol. 50, No. 1, Jan. 2006 pp. 69-79.

Sun, J.Z., Spin angular momentum transfer in current-prpendicular nanomagnetic junctions, IBM J. Res. & Dev., vol. 50, No. 1, Jan. 2006, pp. 81-100.

Wolf, S.A., Spintronics—A retrospective and perspective, IBM J. Res. & Dev., vol. 50, No. 1, Jan. 2006, pp. 101-110.

Gaidis, M.C., Two-level BEOL processing for rapid iteration in MRAM development, IBM J. Res. & Dev., vol. 50, No. 1, Jan. 2006, pp. 41-54.

Ikeda, S., Magnetic Tunnel Junctions for Spintronic Memories and Beyond, IEEE Trans. on Electron Devices, vol. 54., No. 5, May 2007, pp. 991-1002.

Johnson, M., Optimized Device Characteristics of Lateral Spin Valves, IEEE Trans. on Electron Devices, vol. 54., No. 5, May 2007, pp. 1024-1031.

Tanaka, M., et al., MOS-Based Spin Devices for Reconfigurable Logic, IEEE Trans. on Electron Devices, vol. 54., No. 5, May 2007, pp. 961-976.

Bibes M., et al., Oxide Spintronics, IEEE Trans. on Electron Devices, vol. 54., No. 5, May 2007, pp. 1003-1023.

Van Roy, W., et al., Spin Injection and Detection in Semiconductors—Electrical Issues and Device Aspects, IEEE Trans. on Electron Devices, vol. 54., No. 5, May 2007, pp. 933-944.

Sanchez, David, et al., Spin-Polarized Transport in II-VI Magnetic Resonant-Tunneling Devices, IEEE Trans. on Electron Devices, vol. 54., No. 5, May 2007, pp. 984-990.

Nitta, J. et al., Electrical Manipulation of Spin Precession in an InGaAs-Based 2DEG Due to the Rashba Spin-Orbit Interaction, IEEE Trans. on Electron Devices, vol. 54., No. 5, May 2007, pp. 955-960.

Flatte, M.E., Spintronics, IEEE Trans. on Electron Devices, vol. 54., No. 5, May 2007, pp. 907-920.

Gould, C. et al., Tunneling Anisotropic Magnetoresistance-Based Devices, IEEE Trans. on Electron Devices, vol. 54., No. 5, May 2007, pp. 977-983.

Pearton, S.J., et al., ZnO Doped With Transition Metal Ions, IEEE Trans. on Electron Devices, vol. 54., No. 5, May 2007, pp. 1040-1048.

Seneor, P. et al., Nanospintronics: when spintronics meets single electron physics, J. Phys: Condens. Matter 19 (2007) 22 pp.

Ernult, F. et al., Spin accumulation in metallic nanoparticles, J. Phys: Condens. Matter 19 (2007) 19 pp.

Dieny, B. et al., Spin Electronics, J. Phys: Condens. Matter 19 (2007) 3 pp.

Kimura, T. et al., Spin transport in lateral ferromagnetic/nonmagnetic hybrid structures, J. Phys: Condens. Matter 19 (2007) 13 pp.

Tiusan, C. et al., Spin tunnelling phenomena in single-crystal magnetic tunnel junction systems, J. Phys: Condens. Matter 19 (2007) 35 pp.

Diao, Z. et al., Spin-transfer torque switching in magnetic tunnel junctions and spin-transfer torque random access memory, J. Phys: Condens. Matter 19 (2007) 13 pp.

Attema, J.J., et al, Spintronic materials based on main-group elements, J. Phys: Condens. Matter 19 (2007) 11 pp.

Moodera, J.S. et al., The phenomena of spin-filter tunnelling, J. Phys: Condens. Matter 19 (2007) 24 pp.

Ding, Y. et al., Fabrication of current-induced magnetization switching devices using etch-back planarization process, J. Appl. Phys. 97 (2005) 3 pp.

Meng, H. et al., Low resistance spin-dependent magnetic tunnel junction nwith high breakdown voltage for current-induced magnetization-switching devices, J. Appl. Phys. 97 (2005) 3 pp.

Meng, H., Spin Transfer with Low Switching Current Density, University of Minnesota, 2006 MINT Review, 14 pp.

Meng, H. et al., Spin Transfer Effect in Magnetic Tunnel Junction with Nano-Current-Channel, University of Minnesota, InterMag 2005, 14 pp.

Meng, H. et al., Composite free layer for high density magnetic random access memory with lower spin transfer current, Appl. Phys. Letters 89 (2006) 3 pp.

Meng, H. et al., Spin transfer in nanomagnetic devices with perpendicular anisotropy, Appl. Phys. Letters 88 (2006) 3 pp.

Meng, H. et al., A Composite Free Layer for High Density Magnetic Random Access Memory with Lower Spin Transfer Current, Submitted to Appl. Phys. Letters, May 2006, 14 pp.

Meng, H. et al., Spin Transfer Effect in Magnetic Tunnel Junction With a Nano-Current-Channel Layer in Free Layer, IEEE Trans. on Magnetics, vol. 41, No. 10, Oct. 2005, pp. 2612-2614.

Meng, H. et al., Spin Transfer Effect in Magnetic Tunnel Junction with Low Resistance, The Center for Micromagnetic and Information Technology (MINT) & Department of Electrical & Computer Engineering, University of Minnesota, 2 pp.

Meng, H. et al., A New Memory Cell Structure for MRAM with Low Writing Threshold, MMM 2005, University of Minnesota, 13 pp.

Meng, H. et al., Spin Transfer in Magnetic Nano Devices with Perpendicular Anisotropy, MMM 2005, University of Minnesota, 13 pp.

Meng, H. et al., Low critical current for spin transfer in magnetic tunnel junctions, Appl. Phys. Letters 88 (2006) 3 pp.

Sossmeier, K.D. et al., Comparison between ac and dc current annealing in CoFeSiB glass-covered amorphouse microwires, J. Phys. D: Appl. Phys. 40 (2007) 3233-3238.

Nowosielski, R. et al., Crystallization kinetics of an amorphous Co77Si11.5B11.5 alloy, JAMME, Jul.-Aug. 2006. vol. 17, Issue 1-2, pp. 121-124.

Hiki, Y., et al., Stabilization of metallic glass by isochronal and isothermal annealing treatments, J. Phys.: Condens. Matter 19 (2007) 2005147 (7 pp).

Kubota, H., et al., Dependence of spin-transfer switching current on free layer thickness in Co-Fe-B/MgO/Co-Fe-B magnetic tunnel junctions, App. Phys. Letters 89, 032505 (2006) (3 pp.).

Tsunekawa, K., et al., Structural and Electrical Properties of (CoxFe100-x)81B19/MgO/(CoxFe100-x)81B19 Magnetic Tunnel Junctions, HA-01 Intermag, May 12, 2006, 15 pp.

Munakata, M., et al., B-Concentration Dependence on Anisotropy Field of CoFeB Thin Film for Gigahertz Frequency Use, IEEE Transactions on Magnetics, vol. 41, No. 10, Oct. 2005, pp. 3262-3264.

Park, C., et al., Annealing effects on structural and transport properties of rf-sputtered CoFeB/MgO/CoFeB magnetic tunnel junctions, J. Applied Physics 99, 08A901 (2006), pp. 2639-2641.

Burton, J.D., et al., Atomic and Electronic Structure of the CoFeB/MgO Interface from First Principles, 3 pp.

Hayakawa, J., et al., Dependence of Giant Tunnel Magnetoresistance of Sputtered CoFeB/MgO/CoFeB Magnetic Tunnel Junctions on MgO Barrier Thickness and Annealing Temperature, 17 pp.

Ikeda, S., et al., Dependence of tunnel magnetoresistance on ferromagnetic electrode materials in MgO-barrier magnetic tunnel junctions, 9 pp.

Lee, Y. M., et al., Giant tunnel magnetoresistance and high annealing stability in CoFeB/MgO/CoFeB magnetic tunnel junctions with synthetic pinned layer, 17 pp.

Albert, F.J., et al., Spin-polarized current switching of a Co thin film nanomagnet, Applied Physics Letters, vol. 77, No. 23, Dec. 4, 2000, pp. 3809-3811.

Emley, N.C., et al., Reduction of spin transfer by synthetic antiferromagnets, Applied Physics Letters, vol. 84, No. 21, May 24, 2004, pp. 4257-4259.

Fuchs, G.D., et al., Spin-transfer effects in nanoscale magnetic tunnel junctions, Applied Physics Letters, vol. 85, No. 7, Aug. 16, 2004, pp. 1205-1207.

Fuchs, G.D., et al., Adjustable spin torque in magnetic tunnel junctions with two fixed layers, Applied Physics Letters, 86, 152509 (2005), 3 pp.

Braganca, P.M., et al., Reducing the critical current for short-pulse spin-transfer switching of nanomagnets, Applied Physics Letters 87, 112507 (2005), 3 pp.

Ozatay, O., et al., Spin transfer by nonuniform current injection into a nanomagnet, Applied Physics Letters 88, 202502 (2006), 3 pp.

Kiselev, S., Spin-Transfer-Driven Magnetic Switching and Precession, Nanomagnetics Workshop, May 14, 2004, 25 pp.

Tinkham, M., et al., Tunneling Through Metallic Quantum Dots, J. of Low Temperature Physics, vol. 118, Nos. 5/6, 2000, pp. 271-285.

Krivorotov, I.N., et al., Large-amplitude coherent spin waves exited by spin-polarized current in nanoscale spin valves, 24 pp.

Pribiag, V.S., et al., Magnetic vortex oscillator driven by dc spin-polarized current, 14 pp.

Salinas, D.G., et al., Effects of spin-orbit interactions on tunneling via discrete energy levels in metal nanoparticles, Physical Review B, vol. 60, No. 8, Aug. 15, 1999, pp. 6137-6145.

Waintal, X., et al., Role of spin-dependent interface scattering in generating current-induced torques in magnetic multilayers, Physical Review B, vol. 62, No. 18, Nov. 1, 2000, pp. 12317-12327.

Kiselev, S. I., et al., Spin-transfer excitations of permalloy nanopillars for large applied currents, Physical Review B 72, 064430 (2005), 10 pp.

Katine, J.A., et al., Current-Driven Magnetization Reversal and Spin-Wave Excitations in Co/Cu/Co Pillars, Physical Review Letters, vol. 84., No. 14, Apr. 3, 2000, pp. 3149-3152.

Myers, E.B., et al., Thermally Activated Magnetic Reversal Induced by a Spin-Polarized Current, Physical Review Letters, vol. 89, No. 19, Nov. 4, 2002, 4 pp.

Albert, F.J., et al., Quantitative Study of Magnetization Reversal by Spin-Polarized Current in Magnetic Multilayer Nanopillars, Physical Review Letters, vol. 89, No. 22, Nov. 25, 2002, 4 pp.

Kiselev, S. I., et al., Current-Induced Nanomagnetic Dynamics for Magnetic Fields Perpendicular to the Sample Plane, Physical Review Letters, vol. 93, No. 3, Jul. 16, 2004, 4 pp.

Krivorotov, I.N., Temperature Dependence of Spin-Transfer-Induced Switching of Nanomagnets, Physical Review Letters, vol. 93. No. 16, Oct. 15, 2004, 4 pp.

Fuchs, G.D., et al., Spin Torque Tunnel-Current Spin Polarization and Magnetoresistance in MgO Magnetic Tunnel Junctions, Physical Review Letters 96, 186603, May 12, 2006, 4 pp.

Myers, E.B., Current-Induced Switching of Domains in Magnetic Multilayer Devices, Science, vol. 285, Aug. 6. 1999, pp. 867-870.

Krivorotov, I.N., Time-Domain Measurements of Nanomagnet Dynamics Driven by Spin-Transfer Torques, Science, vol. 307, Jan. 14, 2005.

Myers, E.B., Currrent-Induced Switching of Domains in Magnetic Multilayer Devices, 14 pp.

Shibata, J., et al., Magnetic Vortex Dynamics Induced by Spin-Transfer Torque, 1 p.

Klaui, M., et al., Direct Observation of Domain-Wall Configurations Transformed by Spin Currents, Physical Review Letters 95, 026601 Jul. 8, 2005, 4 pp.

Thomas, L., et al., Oscillatory dependence of current-driven magnetic domain wall motion on current pulse length, Nature, vol. 443/14, Sep. 2006, pp. 197-200.

Saitoh, E., et al., Current-induced resonance and mass determination of a single magnetic domain wall, Nature, vol. 431, Nov. 11, 2004, pp. 203-206.

Jung, S-W, et al., Current-Induced Magnetic Domain-Wall Motion by Spin Transfer Torque: Collective Coordinate Approach with Domain-Wall Width Variation, 13 pp.

Vanhaverbeke, A., et al., Transverse domain wall propagated by spin-polarized current, IBM Research, Zurich Research Laboratory, 1 p.

Bazaliy, Y.B., et al., Nonlinear regimes of current-induced domain wall motion, 29 pp.

Waintal, X., et al., Current induced distortion of a magnetic domain wall, May 9, 2007, 5 pp.

Laufenberg, M., Dissertation, Interactions Between Current and Domain Wall Spin Structures, Jul. 26, 2006, 210 pp.

Vernier, N., et al., Domain wall propagation in magnetic nanowires by spin polarized current injection, 17 pp.

Beach, G.S.D., et al., Dynamics of field-driven domain-wall propagation in ferromagnetic nanowires, Nature Materials 4, 741-744 (2005).

Varga, E., Domain wall motion in permalloy wires, 12 pp.

Lua, S.Y.H., et al., Effect of an exchange tab on the magnetization switching process of magnetic nanowires, J. Phys. D: Appl. Phys 40 (2007) 3011-3015.

Ohno, H., et al., Electrical Manipulation of Domain Walls in Ferromagnetic Semiconductors, Croucher Advanced Study Institute—Science and Applications of Spin Electronics, The University of Hong Kong, Aug. 15-20, 2005, 23 pp.

Stiles, M.D., et al., Adiabatic Domain Wall Motion and Landau-Lifshitz Damping, May 31, 2007. 6 pp.

Jubert, P.O., Structure and current-induced motion of magnetic domain walls, 4 pp.

Berakdar, J., et al., Spin transport and spin torque in a magnetic nanowire with a non-collinear magnetic order, J. Physics: Conference Series 61 (2007) 105-109.

Lee, Y.M. et al., Giant tunnel magnetoresistance and high annealing stability in CoFeB/MgO/CoFeB magntic tunnel junctions with synthetic pinned layer, Appl. Phys. Lett. 89, 042506 (2006), 3 pp.

FEI Company Product Data, VectraVision System, FIB System for Advanced Circuit Editing, 2003, 4 pp.

FEI Company, Tools for Nanotech, CoppeRx II for Mixed-Field FIB Deprocessing, 2006, 1 p.

MoberlyChan, W.J. et al., Fundamentals of Focused Ion Beam Nanostructural Processing: Below, At, and Above the Surface, MRS Bulletin, vol. 32, May 2007, pp. 414-432.

Abstracts, 52nd Magnetism and Magnetic Materials Conference, Nov. 2007, 143 pp.

Zhu, J., Microwave-assisted magnetic recording, International Storage Technology Symposium, Jun. 18-21, 2007, 35 pp.

Kryder, M.H., Perspective on Future Storage Technologies, International Storage Technology Symposium, Jun. 18-21, 2007, 35 pp.

Wood, R. et al., From Rotating- to Solid-State- to 3D-Storage?, Brainstorming the Future, International Storage Technology Symposium, Jun. 18-21, 2007, 6 pp.

Rosen, H., Nano-Bio-Magnetic Horizons, International Storage Technology Symposium, Jun. 18-21, 2007, 14 pp.

Komineas, S., Propagating Coherent Structures in Nanowires, International Storage Technology Symposium, Jun. 18-21, 2007, 12 pp.

Knight, G., Probe-Based Storage: Mechanical Access on a Nano-Scale, International Storage Technology Symposium, Jun. 18-21, 2007, 16 pp.

Knight, G., Semiconductor/Flash Memory Overview, International Storage Technology Symposium, Jun. 18-21, 2007, 19 pp.

Theodonis, I., Spin Transfer Torque (STT) in Magnetic Tunnel Junctions, International Storage Technology Symposium, Jun. 18-21, 2007, 21 pp.

Rohrmann, H., Multilayer and Granular Films on Nanospheres, International Storage Technology Symposium, Jun. 18-21, 2007, 41 pp.

Pearton, S.J. et al., Dry Etching of MRAM Structures, Mat. Res. Soc. Symp. Proc., vol. 614, 2000, 11 pp.

Yung, R.B. et al., Control of Chlorine Inductively Coupled Plasma Using Optical-Emission Spectroscopy, J. Elec. Mat., vol. 31, No. 10, 2002, pp. 994-998.

Ditizio, R. et al., Memory: MRAM Design, Cell Shape and Patterning Considerations for Magnetic Random Access Memory (MRAM) Fabrication, Semiconductor Manufacturing Magazine, pp. 90-96.

Wong, D.F. et al., Magnetic mesa structures fabricated by reactive ion etching with CO/NH3/Xe plasma chemistry for an all-silicon quantum computer, Nanotechnology 16 (2005), pp. 990-994.

Lee, J.W. et al., High-density plasma etching of CoFeSiB magnetic films with hard mask, Journal of Magnetism and Magnetic Materials 304 (2006), pp. c282-c284.

Mukai, T. et al., High-Performance and Damage-Free Magnetic Film Etching using Pulse-Time-Modulated Cl2 Plasma, Jpn. J. Appl. Phys., vol. 45, No. 6B (2006), pp. 5542-5544.

Park, I.H. et al., Nanometer-sized etching of magnetic tunnel junction stack for magnetic random access memory, Journal of Magnetism and Magnetic Materials 304 (2006), pp. c264-c266.

Ruzic, D., Highlights in Plasma Science from around the world, Plasma Material Interaction Group, Univ. of Illinois, Sep. 2006, 55 pp.

Shin, B. et al., Etch Characteristics of CoFeSiB Magnetic Films Using Inductively Coupled Plasma Reactive Ion Etching for Magnetic Random Access Memory, Integrated Ferroelectrics 78, 2006. pp. 223-243.

Takahashi, S. et al., Ion-Beam-Etched Profile Control of MTJ Cells for Improving the Switching Characteristics of High-Density MRAM, IEEE Transactions on Magnetics, vol. 42, No. 10, Oct. 2006, pp. 2745-2747.

Plasma Lab C.Y.C.U., 26 pp.

Etching, Feb. 20, 2005, 110 pp.

ISSCC-2007: Hitachi/Tohuku Univ; Paper D26-5, 12 pp.

Reactive Ion Etching of Magnetic Materials, ISSCC-2007: Hitachi/Tohuku Univ; Paper D26-5, 12 pp.

Rack, P.D., Plasma Etching Outline, Univ. of Tennessee, 34 pp.

An Introduction of Etch Process, Hynix, 69 pp.

Ricci, A., Dry Etch Process Application Note, Pall Microelectronics ABG-106-0405, 6 pp.

Volkert, C.A. et al., Focused Ion Beam Microscopy and Micromachining, MRS Bulletin, vol. 32, May 2007, pp. 389-400.

Mayer, J. et al., TEM Sample Preparation and FIB-Induced Damage, MRS Bulletin, vol. 32, May 2007, pp. 400-407.

Jung, K.B. et al., Electron Cyclotron Resonance Plasma Etching of Materials for Magneto-Resistive Random Access Memory, J. Elec. Mater., vol. 26, No. 11, 1997, pp. 1310-1313.

Balke, B. et al., Mn3Ga, a compensated ferrimagnet with high Curie temperature and low magnetic moment for spin torque transfer applications, Appl. Phys. Lett. 90, 152504 (2007), 3 pp.

Demidov, V.E. et al., Effect of spin-polarized electric current on spin-wave radiation by spin-valve nanocontacts, Appl. Phys. Lett. 90, 172508 (2007), 3 pp.

Laribi, S. et al., Reversible and irreversible current induced domain wall motion in CoFeB based spin valves stripes, Appl. Phys. Lett. 90, 232505 (2007), 3 pp.

V600FIB System, The Most Efficient, Flexible and Cost-effective Device Modification Tool Available for Today's Semiconductor Lab, FEI Company Product Data 2006, 4 pp.

Seo, S-M. et al., Effect of shape anisotropy on threshold current density for current-induced domain wall motion, Appl. Phys. Lett. 90, 252508 (2007), 3 pp.

CMP Technology, 14 pp.

Zhang, S., Current research in current-driven magnetization dynamics, University of Missour-Columbia, Feb. 14, 2006, 48 pp.

Mahorowala, A. et al., Etching of polysilicon in an Inductively Coupled Cl2 and HBr Discharges: III. Photoresist Mask Faceting, Sidewall Deposition, and Microtrenching, Mass. Inst. of Technology, 19 pp.

Consolo, G. et al., Influence of Different Spatial Distributions of Current Density and Spin-Torque Efficiency in the Dynamics of Point-Contact Devices, IEEE Transactions on Magnetics, vol. 43, No. 6, Jun. 2007, 2827-2829.

Guo, J. et al., Effect of Gilbert Damping Term on the Current Induced Magnetization Switching of Ring-Shaped Spin Valve Structures, IEEE Transactions on Magnetics, vol. 43, No. 6, Jun. 2007, 2923-2925.

Lee, J.M. et al., Spin Transfer Magnetization Switching Read/Write Cycle Test in MgO-Based Magntic Tunnel Junctions, IEEE Transactions on Magnetics, vol. 43, No. 7, Jul. 2007, 3349-3353.

Zhu, X. et al., Effect of Damping Constant on Magnetic Switching in Spin Torque Driven Perpendicular MRAM, IEEE Transactions on Magnetics, vol. 43, No. 6, Jun. 2007, 2349-2351.

Myers, E.B. et al., Interplay of Spin-Transfer Torques and Thermal Activation in Nanomagnet Reversal, Cornell University, 14 pp.

Lithography, Lecture 15 (Alignment and Exposure), Semiconductor Manufacturing Technology, Chapters 13-15, 71 pp.

delMoral, A., Magnetostriction: fundamental principles and novel magneto-strictive materials, Europhysics News (2003) vol. 34, No. 6., 9 pp.

Huai, Y. et al., Spin transfer switching current reduction in magnetic tunnel junction based dual spin filter structures, Appl. Phys. Lett. 87, 222510 (2005), 3 pp.

Hayakawa, J. et al., Current-Driven Magnetization Switching in CoFeB/MgO/CoFeB Magnetic Tunnel Junctions, JJAP, vol. 44, No. 41, 2005, pp. L1267-L1270.

Kalitsov, A. et al., Spin-polarized current-induced torque in magnetic tunnel junctions, J. Appl. Phys. 99, 08G501 (2006), 3 pp.

Vedyayev, A. et al., Resonant spin-torque in double barrier magnetic tunnel junctions, Physics Letters A 355 (2006), pp. 243-246.

Manchon, A. Modelling spin transfer torque and magnetoresistance in magnetic multilayers, J. Phys.: Condens. Matter 19 (2007) 165212, 42 pp.

Mangin, S. et al., Current-induced magnetization reversal in nanopillars with perpendicular anisotropy, Nature Materials, vol. 5, Mar. 2006, pp. 210-215.

Wetzels, W. Interaction effects in spin-valve structures, Casimir PhD Series, Delft-Leiden, Mar. 2007, 117 pp.

Stiles, M.D. et al., Phenomenological Theory of Current-Induced Magnetization Precession, 16 pp.

Jeong, W.C. et al., Field assisted spin switching in magnetic random access memory, Samsung Electronics Co., Ltd., 14 pp.

Boulle, O. et al., Shaped Angular dependence of the spin transfer torque and microwave generation without magnetic field, 17 pp.

Wei, Z. et al., Spin transfer in an antiferromagnet, 5 pp.

Rivkin, K. et al., Switching spin valves using r.f. currents, 15 pp.

Yang, T. et al., Influence of capping layer on the current-induced magnetization switching in magnetic nanopillars, J. Appl Phys. 99, 073708 (2006), 5 pp.

Ji, Y. et al., Current-induced spin-wave excitations in a single ferromagnetic layer, 4 pp.

Nozieres, J.P., Magnetic Random Access Memories (M-RAM): A truly universal memory?, SPINTEC, 8 pp.

Dieny, B., Spintronics, Hong Kong Critical Components Manufacturing Inustry Quarterly Journal (Jun. 2002), 4 pp.

Dieny, B., Spin-Valves, 104 pp.

Karabacak, T. et al., Enhanced Step Coverage of Thin Films on Patterned Substrates by Oblique Angle Physical Vapor Deposition, May 22, 2004, 21 pp.

Yoda, H. et al., 1.8 V Power Supply 16 Mb-MRAMs With 42.3% Array Efficiency, IEEE Transactions on Magnetics, vol. 42, No. 10, Oct. 2006, pp. 2724-2726.

Engel, B.N. et al., A 4-Mb Toggle MRAM Based on a Novel Bit and Switching Method, IEEE Transactions on Magnetics, vol. 41, No. 1, Jan. 2005, pp. 132-136.

Tsuji, K. et al., 0.1 um-rule MRAM Development using Double-Layered Hard Mask, IEEE, IEDM 01-799-802.

Dittrich, R. et al., Energy barriers in magnetic random access memory elements, IEEE, 3 pp.

Slaughter, J. et al., MRAM Technology: Status and Future Challenges, Cornell CNS Nanotechnology Symposium, May 14, 2004, 45 pp.

Dave, Renu W., et al., MgO-Based Tunnel Junction Material for High-Speed Toggle Magnetic Random Access Memory, IEEE Transactions on Magnetics, vol. 42, No. 8, Aug. 2006. pp. 1935-1939.

Ju, K. et al., Multibit Cells Schemes for Toggle MRAM Applications, IEEE Transactions on Magnetics, vol. 42, No. 10, Oct. 2006, pp. 2730-2732.

Tehrani, S., Magnetoresistive RAM, Freescale Semiconductor, Jul. 17, 2007, 27 pp.

Boeve, H. et al., Technology assessment for the implementation of magnetoresistive elements with semiconductor components in magnetic random access memory (MRAM) architecture, IEEE Transactions on Magnetics, vol. 35, No. 5, Sep. 1999, pp. 2820-2825.

Schrefl, T. et al., Micromagnetic Simulations and Applications, Vienna University of Technology, 5 pp.

Kasai, S. et al., Current-driven resonant excitation of magnetic vortex, 16 pp.

Pribiag, V.S. et al., Magnetic vortex oscillator driven by dc spin-polarized current, Cornell University, 14 pp.

Acremann, Y. et al., Time Resolved Imaging of Spin Transfer Switching: Beyond the Macro-Spin Concept, PRL 96, 217202 (2006), 4 pp.

Ohldag, H. et al., Interfacial Moments in Co/NiO Origins of Antiferromagnetic/Ferromagnetic Coupling, 1 large page.

Ultrafast Magnetic Switching of Nanoelements with Spin Currents, Spin Injection, 8 pp.

Stohr, J., Probing the Ultrafast Magnetic Nanoworld with X-Rays, Stanford Synchrotron Radiation Laboratory, Stanford University, 43 pp.

Stohr, J., Soft X-Ray Science—From Photon Drought to Free Electron Lasers, Stanford Synchrotron Radiation Laboratory, 30 pp.

Stohr, J., The Magic of Magnetism: From Physical Attraction to Spin Doctors, Stanford Synchrotron Radiation Laboratory, Stanford Linear Accelerator Center, 45 pp.

Urban, R. et al., Gilbert Damping in Single and Multilayer Ultrathin Films: Role of Interfaces in Nonlocal Spin Dynamics, PRB, vol. 87, No. 21, 4 pp.

Fuchs, G.D. et al., Adjustable spin torque in magnetic tunnel junctions with two fixed layers, Appl. Phys. Lett. 86, 152509 (2005), 3 pp.

Petukhov, A.G. et al., 100% spin accumulation in non-half-metallic ferromagnet-semiconductor junctions, J. Phys.: Condens. Matter 19 (2007) 315205, 16 pp.

Bowen, M. et al., Using half-metallic manganite interfaces to reveal insights into spintronics, J. Phys.: Condens. Matter 19 (2007) 315208, 27 pp.

Galanakis, I. et al., Spin-polarization and electronic properties of half-metallic Heusler alloys calculated from first principles, J. Phys., Condens. Matter 19 (2007) 315213, 16 pp.

Chen, T.Y. et al., Current-Driven Switching in a Single Exchange-Biased Ferromagnetic Layer, 3 pp.

Isogami, S. et al., Current-Induced Magnetization Switching and CPP-GMR in 30 nm o/ Scale Spin Valves Fabricated Using EB-Assisted CVD Hard Masks, IEEE Transactions on Magnetics, vol. 42, No. 10, Oct. 2006, pp. 2676-2678.

Chen, T.Y. et al., Current-Driven Switching in a Single Exchange-Biased Ferromagnetic Layer, J. Appl. Phys. 97, 10C709 (2005) 3 pp.

Craig, B.R. et al., The effect of roughness on the micromagnetic properties of high moment multilayer films, J. Phys. D: Appl. Phys. 40 (2007), pp. 3991-3997.

Park, C. et al., Effect of Adjacent Layers on Crystallization and Magnetoresistance in CoFeB/MgO/CoFeB Magnetic Tunnel Junction, IEEE Transactions on Magnetics, vol. 42, No. 10, Oct. 2006, pp. 2639-2641.

Kim, K-S et al., Effect of Nitrogen Incorporation to Oxidation Process on the Reliability of Magnetic Tunnel Junctions, IEEE Transactions on Magnetics, vol. 42, No. 1, Jan. 2006, pp. 2-4.

Yang, T. et al., Estimation of local and nonlocal contributions to the current-induced magnetization switching, Phys. Rev. B 74, 153301 (2006), 4 pp.

MacGillivray, G., Flash Memory Trends & Perspectives, Semiconductor Insights, 24 pp.

Marukame, T. et al., Highly Spin-Polarized Tunneling in Fully Epitaxial Magnetic Tunnel Junctions Using Full-Heusler Alloy Co2Cr0.6Fe0.4Al Thin Film and MgO Tunnel Barrier, IEEE Transactions on Magnetics, vol. 42, No. 10, Oct. 2006, pp. 2652-2654.

Meng, H. et al., A New Memory Cell Structure for Magnetic Random Access Memory with Low Writing Threshold, The Center for Micromagnetic and Information Technology (MINT) & Department of Electrical & Computer Engineering, University of Minnesota, 1 p.

Wang, J.-P. et al., Spin Transfer in Magnetic Nano Devices with Perpendicular Anisotropy, University of Minnesota, 2006 APS A-22. 00011, 14 pp.

Lo, T.N. et al., E-beam lithography and electrodeposition fabrication of thick nanostructured devices, J. Phys. D: Appl. Phys 40 (2007) pp. 3172-3176.

Technology Backgrounder: Immersion Lithography, IC Knowledge 2003, 5 pp.

Martin, J.I. et al., Ordered magnetic nanostructures: fabrication and properties, J. Magnetism and Magnetic Materials 256 (2003) pp. 449-501.

Onai, T. et al., Outlook for Advanced Semiconductor Process and Manufacturing Technologies, Hitachi Review, vol. 52 (2003) No. 3, pp. 117-124.

Garner, C.M., Technology Challenges & Opportunities for Nanomaterials, 2007 ITRS Public Conference, 15 pp.

Chezan, A.R. et al., Influence of stresses and magnetostriction on the soft magnetic behavior of metallic films, J. Magnetism and Magnetic Materials 299 (2006) pp. 219-224.

Wang, D. et al., Magnetostriction Effect of Amorphous CoFeB Thin Films and Application in Spin Dependent Tunnel Junctions, NVE Corporation, 2004, pp. 1-14.

Shin, C.-S. et al., Growth, surface morphology, and electrical resistivity of fully strained substoichiometric epitaxial $TiN_x$ ($0.67 < x < 1.0$) layers on MgO(001), J. Appl. Phys., vol. 95, No. 1, Jan. 1, 2004, pp. 356-362.

Itoh, H., Theory of tunnel magnetoresistance and spin filter effect in magnetic tunnel junctions, J. Phys. D: Appl. Phys. 40 (2007) 1228-1233.

Liu, X. et al., Thermal stability of magnetic tunneling junctions with MgO barriers for high temperature spintronics, Appl. Phys. Lett. 89, 023504 (2006) 3 pp.

Trachenko, K. et al., How the nature of the chemical bond governs resistance to amorphization by radiation damage, Physical Review B 71, 184104 (2005) 5 pp.

Shen, W. et al., Effect of film roughness in MgO-based magnetic tunnel junctions, Appl. Phys. Lett. 88, 182508 (2006) 3 pp.

Ikeda, S. et al., Dependence of tunnel magnetoresistance in MgO based magnetic tunnel junctions on Ar pressure during MgO sputtering, 19 pp.

Miao, G-X. et al., Inelastic tunneling spectroscopy of magnetic tunnel junctions based on CoFeB/MgO/CoFeB with Mg insertion layer, J. Appl. Phys. 99, 08T305 (2006) 3 pp.

Diao, Z. et al., Spin transfer switching in dual MgO magnetic tunnel junctions, Appl. Phys. Lett. 90, 132508 (2007) 3 pp.

Padhan, P. et al., Frequency-dependent magnetoresistance and magnetocapacitance properties of magnetic tunnel junctions with MgO tunnel barrier, Appl. Phys. Lett. 90, 142105 (2007) 3 pp.

Lee, J.M. et al., Current-Induced Magnetization Switching Probability in MgO-Based Magnetic Tunnel Junctions, IEEE Transactions on Magnetics, vol. 43, No. 2, Feb. 2007, pp. 917-919.

Kawahara, T. et al., 2Mb Spin-Transfer Torque RAM (SPRAM) with Bit-by-Bit Bidirectional Current Write and Parallelizing-Direction Current Read, ISSCC 2007, Session 26, Non-Volatile Memories, 26.5, pp. 480-481.

Lee, Y.M. et al., Giant tunnel magnetoresistance and high annealing stability in CoFeB/MgO/CoFeB magnetic tunnel junctions with synthetic pinned inned layer, pp. 1-17.

Dave, R.W. et al., MgO-Based Tunnel Junction Material for High-Speed Toggle Magnetic Random Access Memory, IEEE Transactions on Magnetics, vol. 42, No. 8, Aug. 2006, pp. 1935-1939.

Lee, K.J., Excitations of Incoherent Spin-Waves due to Spin-Transfer Torque, pp. 1-14.

Kiselev, S.I. et al., Current-Induced Nanomagnetic Dynamics for Magnetic Fields Perpendicular to the Sample Plane, Phys. Rev. Lett., vol. 93, No. 3, Jul. 16, 2004, 4 pp.

Sankey, J.C. et al., Mechanisms limiting the coherence time of spontaneous magnetic oscillations driven by dc spin-polarized currents, Physical Review B 72, 224427 (2005) 5 pp.

Nogi, Y. et al., Preparation and magnetotransport properties of MgO-barrier-based magnetic double tunnel junctions including nonmagnetic nanoparticles, J. Phys. D: Appl. Phys. 40 )2007) pp. 1242-1246.

Barnetson, D., QDMtm Flash Memory, Semicon West 2007, Jul. 17, 2007, 18 pp.

Ernult, F. et al., Spin accumulation in metallic nanoparticles, J. Phys.: Condens. Matter 19 (2007) 165214, 19 pp.

Hayakawa, J. et al., Current-driven switching of exchange biased spin-valve giant magnetoresistive nanopillars using a conducting nanoprobe, J. Appl. Phys., vol. 96, No. 6, Sep. 15, 2004, pp. 3440-3442.

Rippard, W.H. et al., Quantitative studies of spin-momentum-transfer-induced excitations in Co/Cu multilayer films using point-contact spectroscopy, Appl. Phys. Lett., vol. 82, No. 8, Feb. 24, 2003, pp. 1260-1262.

Chen, T.Y. et al., Current-induced switching in a single exchange-biased ferromagnetic layer, J. Appl. Phys. 97, 10C709 (2005) 3 pp.

Chen, T.Y. et al., Enhanced Magnetoresistance Induced by Spin Transfer Torque in Granular Films with a Magnetic Field, PRL 96, 207203 (2006) 4 pp.

Chen, T. et et al., Oxygen-pressure dependence of the crystallinity of MgO films grown on Si(1 0 0) by PLD, Journal of Crystal Growth 270 (2004), pp. 553-559.

Xiao, J. et al., Macrospin models of spin transfer dynamics, Phys. Rev. B 72, 014446 (2005), 13 pp.

Stiles, M.D. et al., Phenomenological Theory of Current-Induced Magnetization Precession, Nov. 20, 2003, 16 pp.

Stiles, M.D. et al., Spin Transfer Torque and Dynamics, 85 pp.

Rippard, W.H. et al., Spin-Transfer Induced Dynamics in Magnetic Nanostructures, NIST nanomagntodynamics and DARPA SpinS program, 29 pp.

Xiao, J. et al., Spin-transfer torque for continuously variable magnetization, Phys. Rev. B 73, 054428 (2006) 10 pp.

Derbenwick, G.F. et al., Advances in FeRAM Technologies, Celis Semiconductor Corporation, 3 pp.

Liu, S. et al., A New Concept for Non-Volatile Memory: The Electric-Pulse Induced Resistive Change Effect in Colossal Magnetoresistive Thin Films, Non-Volatile Memory Conference, San Diego, CA, Nov. 6-7, 2001, 32 pp.

Liu, S.Q. et al., A New Concept for Non-Volatile Memory: The Electric-Pulse Induced Resistive Change Effect in Colossal Magnetoresistive Thin Films, Space Vacuum Epitaxy Center, 7 pp.

Dippert, B., Hitting their stride: Nonvolatile-memory upstarts draw near to established leaders, designfeature: Advanced nonvolatile memories, Jan. 20, 2005, EDN 55, 6 pp.

Lupo, D.W., Thin Film Electronics ASA, ThinFilm Presentation, May 9, 2007, Thin Film Electronics, 33 pp.

Derbenwick, G.F. et al., Advances in FeRAM Technology, Non Volatile Memory Technology Symposium, Nov. 15-16, 2000, Arlington, VA, 23 pp.

Lenssen, J.-M.H. et al., Expectations of MRAM in comparison with other non-volatile memory technologies, 6 pp.

Maimon, J. et al., Chalcogenide-Based Non-Volatile Memory Technology, Mission Research Corporation, 18 p.

Deak, J.G., Spin Injection in Thermally Assisted Magnetic Random Access Memory, NVE Corporation, 15 pp.

Anderson, J.M. et al., Address line-assisted switching of vertical magnetoresistive random access memory (VMRAM) cells, 49th Conference on Magnetism and Magnetic Materials, 15 pp.

Daughton, J., Magnetic Spin Devices: 7 Years from Lab to Product, Symposium X, MRS 2004 Fall Meeting, Dec. 1, 2004, 27 pp.

Coyne, J., Storage Market: Opportunities, Myths and Facts, Western Digital, May 17, 2007, 24 pp.

Xu, Y. et al., In Situ ordering of FePt thin films with face-centered-tetragonal (001) texture on Cr100-xRux underlayer at low substrate temperature, App. Phys. Lett., vol. 80, No. 18, May 6, 2002, pp. 3325-3327.

Grollier, J. et al., Spin-polarized current induced switching in Co/Cu/Co pillars, App. Phys. Lett., vol. 78, No. 23, Jun. 4, 2001, pp. 3663-3665.

Sun, C.J. et al., Epitaxial L1o FePt magnetic thin films sputtered on Cu (001), App. Phys. Lett., vol. 82, No. 12, Mar. 24, 2003, pp. 1902-1904.

Yagami, K. et al., Low-current spin-transfer switching and its thermal durability in a low-saturation-magnetization nanomagnet, App. Phys. Lett., vol. 85, No. 23, Dec. 6, 2004, pp. 5634-5636.

Wang, J-P et al., Composite media (dynamic tilted media) for magnetic recording, App. Phys. Lett. 86 (2005), 3 pp.

Seki, T. et al., Spin-polarized current-induced magnetization reversal in perpendicularly magnetized L1o-FePt layers, App. Phys. Lett. 88 (2006), 3 pp.

Gu, J. et al., Distributed Active Decoupling Capacitors for On-Chip Supply Noise Cancellation in Digital VLSI Circuits, IEEE 2660 Symp. on VLSI Circuits Digest of Tech. Papers, 2 pp.

Durlam, M. et al., A 1-Mbit MRAM Based on 1T1MTJ Bit Cell Integrated With Copper Interconnects, IEEE J. of Solid-State Circuits, vol. 38, No. 5, May 2003, pp. 769-773.

Kim, C.H. et al., PVT-Aware Leakage Reduction for On-Die Caches With Improved Read Stability, IEEE J. of Solid-State Circuits, vol. 41, No. 1, Jan. 2006, pp. 170-178.

Kim, T-H et al., A 0.2 V, 480 kb Subthreshold SRAM With 1 k Cells Per Bitline for Ultra-Low-Voltage Computing, IEEE J. of Solid-State Circuits, vol. 43, No. 2, Feb. 2008, pp. 518-529.

Kim, T-H et al., Silicon Odometer: An On-Chip Reliability Monitor for Measuring Frequency Degradation of Digital Circuits, IEEE J. of Solid-State Circuits, vol. 43, No. 4, Apr. 2008, pp. 874-880.

Tehrani, S. et al., Progress and Outlook for MRAM Technology, IEEE Transactions on Magnetics, vol. 35, No. 5, Sep. 1999, pp. 2814-2819.

Victora, R.H. et al., Composite Media for Perpendicular Magnetic Recording, IEEE Transactions on Magnetics, vol. 41, No. 2, Feb. 2005, pp. 537-542.

Kim, T-H et al., A High-Density Subthreshold SRAM with Data-Independent Bitline Leakage and Virtual Ground Replica Scheme, 2007 IEEE International Solid-State Circuits Conference, 3 pp.

Kil, J. et al., A High-Speed Variation-Tolerant Interconnect Technique for Sub-Threshold Circuits Using Capacitive Boosting, ISLPED '06, Oct. 4-6, 2006, pp. 67-72.

Keane, J. et al., An On-Chip NBTI Sensor for Measuring PMOS Threshold Voltage Degradation, ISLPED '07, Aug. 27-29, 2007, pp. 189-194.

Kim, C.H. et al., PVT-Aware Leakage Reduction for On-Die Caches with Improved Read Stability, 2005 IEEE International Solid-State Circuits Conference, 3 pp.

Sousa, R.C. et al., Tunneling hot spots and heating in magnetic tunnel junctions, J. Appl. Phys., vol. 95, No. 11, Jun. 1, 2004, pp. 6783-6785.

Shen, W.K. et al., In situ epitaxial growth of ordered FePt (001) films with ultra small and uniform grain size using a RuAI underlayer, J. Appl. Phys. 97 (2005), 3 pp.

Zhu, J-G, Pinholes and spin transfer effect in magnetic tunnel junction heads, J. Appl. Phys. 97 (2005), 3 pp.

Parkin, S.S.P. et al., Giant tunnelling magnetoresistance at room temperature with MgO (100) tunnel barriers, Nature Materials, vol. 3, Dec. 2004, pp. 862-867.

Yuasa, S. et al., Giant room-temperature magnetoresistance in single-crystal Fe/MgO/Fe magnetic tunnel junctions, Nature Materials, Vol. 3, Dec. 2004, pp. 868-871.

Kaka, S. et al., Mutual phase-locking of microwave spin torque nano-oscillators, Nature Letters, vol. 437, Sep. 15, 2005, pp. 389-392.

Mancoff, F.B. et al., Phase-locking in double-point-contact spin-transfer devices, Nature Letters, vol. 437, Sep. 15, 2005, pp. 393-395.

Tsoi, M. et al., Excitation of a Magnetic Multilayer by an Electric Current, PRL, vol. 80, No. 19, May 11, 1998, pp. 4281-4284.

Jiang, Y. et al., Effective Reduction of Critical Current for Current-Induced Magnetization Switching by a Ru Layer Insertion in an Exchange-Biased Spin Valve, PRL, vol. 92, No. 16, Apr. 23, 2004, 4 pp.

Rippard, W.H. et al., Injection Locking and Phase Control of Spin Transfer Nano-oscillators, PRL 95, Aug. 5, 2005, 4 pp.

Gu, J. et al., A Switched Decoupling Capacitor Circuit for On-Chip Supply Resonance Damping, 2007 Symp. on VLSI Circuits Digest of Technical Papers, pp. 126-127.

Kim, T-H et al., Silicon Odometer: An On-Chip Reliability Monitor for Measuring Frequency Degradation of Digital Circuits, 2007 Symp. on VLSI Circuits Digest of Technical Papers, pp. 122-123.

Kim, C.H. et al., A Process Variation Compensating Technique for Sub-90nm Dynamic Circuits, 2003 Symp. on VLSI Circuits Digest of Technical Papers, pp. 205-207.

Kim, C.H. et al., An On-Die CMOS Leakage Current Sensor for Measuring Process Variation in Sub-90nm Generations, 2005 IEEE International Conference on Integrated Circuit and Technology, 2 pp.

Tondra, M. et al., High Temperature Pinning Properties of IrMn vs. FeMn in Spin Valves, J. Vacuum Science and Technology, Jul./Aug. 1999, 15 pp.

Deak, J., Thermal Magnetic Random Access Memory, IEEE International Conference on Computer Design, New Memory Technologies, Oct. 4, 2005, 38 pp.

Deak, J. et al., Effect of Resistance-Area-Product and Thermal Environment on Writing of Magneto-Thermal MRAM, Mar. 13, 2006, 3 pp.

Daughton, J., Spintronic Applications at NVE, Cornell University, May 14, 2004, 39 pp.

Wang, D. et al., Spin dependent tunneling junctions with reduced Neel coupling, J. Appl. Phys., vol. 93, No. 10, Parts 2 & 3, May 15, 2003, pp. 8558-8560.

Sinclair, A. et al., Scaling and Power Properties of Thermally Written MRAM, Abstract, NVE Corporation, 1 p.

Carson, J.C. et al., High Density Packaging of Non-Volatile Memory, Irvine Sensors Corporation, 3 pp.

Diao, Z. et al., Spin-transfer torque switching in magnetic tunnel junctions and spin-transfer torque random access memory, J. Phys. Condens. Matter 19 (2007) 165209, 13 pp.

Manchon, A. et al., Modelling spin transfer torque and magnetoresistance in magnetic multilayers, J. Phys. Condens. Matter 19 (2007) 165212, 42 pp.

Tiusan, C. et al., Spin tunnelling phenomena in single-crystal magnetic tunnel junction systems, J. Phys. Condens. Matter 19 (2007) 165201, 35 pp.

Ochiai, T. et al., Distinctive current-induced magnetization switching in a current-perpendicular-to-plane giant-magnetoresistance nanopillar with a synthetic antiferromagnet free layer, Appl. Phys. Lett 86, 242506 (2005), 3 pp.

Berger, L., Multilayer configuration for experiments of spin precession induced by a dc current, J. Appl. Phys., vol. 93, No. 10, Parts 2 & 3, May 15, 2003, pp. 7693-7695.

Jiang, Y. et al., Substantial reduction of critical current for magnetization switching in an exchange-biased spin valve, Nature Materials, vol. 3, Jun. 2004, pp. 361-364.

Slonczewski, J.C., Conductance and exchange coupling of two ferromagnets separated by a tunneling barrier, Phys. Rev. B, vol. 39, No. 10, Apr. 1, 1989, pp. 6995-7002.

Slonczewski, J.C., Currents, torques, and polarization factors in magnetic tunnel junctions, Phys. Rev. B 71, 024411 (2005), 10 pp.

Mao, S. et al., Commercial TMR Heads for Hard Disk Drives: Characterization and Extendibility At 300 Gbit/in2, IEEE Transactions on Magnetics, vol. 42, No. 2, Feb. 2006, pp. 97-102.

Shimazawa, K. et al., Enhanced GMR Ratio of Dual Spin Valve With Monolayer Pinned Structure, IEEE Transactions on Magnetics, vol. 42, No. 2, Feb. 2006, pp. 120-125.

Wurz, M.C. et al., Fabrication of a Micro Coil for Magnetooptical Data Storage, IEEE Transactions on Magnetics, vol. 42, No. 10, Oct. 2006, pp. 2468-2470.

Rottmayer, R.E. et al., Heat-Assisted Magnetic Recording, IEEE Transactions on Magnetics, vol. 42, No. 10, Oct. 2006, pp. 2417-2421.

Covington, M., Spin transfer and other challenges in data storage, Seagate Research, Pittsburgh, PA, 27 pp.

Kumar, S.B. et al., MR Enhancement in a Current Perpendicular-to-Plane Spin Valve by Insertion of a Ferromagnetic Layer Within the Space Layer, IEEE Transactions on Magnetics, vol. 42, No. 10, Oct. 2006, pp. 2459-2461.

Wong, R-K. et al., Reliability of Tunneling Magnetoresistance Recording Head—Lifetime, Failure Mode, and Production Screening, IEEE Transactions on Magnetics, vol. 42, No. 2, Feb. 2006, pp. 232-236.

White, R.M. et al., Spin Transfer Stimulated Noise in Magnetic Recording Heads, Data Storage Systems Center, 41 pp.

Park, C. et al., Annealing effects on structural and transport properties of rf-sputtered CoFeB/MgO/CoFeB magnetic tunnel junctions, J. Appl. Phys. 99, 08A901 (2006), 3 pp.

Wiese, N. et al., Antiferromagnetically coupled CoFeB/Ru/CoFeB trilayers, arXiv:cond-mat/0509749v1, Sep. 28, 2005, 3 pp.

Peng, Y. et al., Characterization of interfacial reactions in magnetite tunnel junctions with transmission electron microscopy, J. Appl. Phys., vol. 95, No. 11, pp. Jun. 1, 2004, 6798-6800.

Svedberg, E.B., Diffusion in Co90Fe10/Ru multilayers, J. Appl. Phys., vol. 94, No. 2, Jul. 15, 2003, pp. 993-1000.

Roy, A.G. et al., Effect of seed layers in improving the crystallographic texture of CoCrPt perpendicular recording media, J. Appl. Phys., vol. 91, No. 10, May 15, 2002, pp. 8076-8078.

Perdue, K.L. et al., Exchange Bias and Giant Magnetoresistance in Spin Valves with Angstrom-Scale Antiferromagnetic Layers at 5 K, Harvey Mudd College, Apr. 29, 2005, 40 pp.

Svedberg, E.B. et al., Interdiffusion in CoFe/Cu multilayers and its application to spin-valve structures for data storage, J. Appl. Phys., vol. 94, No. 2, Jul. 15, 2003, pp. 1001-1006.

Park, C. et al., Interfacial Composition and Microstructure of Fe3O4 Magnetic Tunnel Junctions, IEEE Transactions on Magnetics, vol. 39, No. 5, Sep. 2003, pp. 2806-2808.

Kim, Y.K. et al., Investigation of Magnetoresistive Characteristics of Metallic Multilayers Comprising Ru-Based Synthetic Antiferromagnetic Layers, J. Korean Phys. Soc., vol. 43, No. 3, Sep. 2003, pp. 396-399.

Moyerman, S. et al., Magnetic structure variations during giant magnetoresistance training in spin valves with picoscale antiferromagnetic layers, J. Appl. Phys. 99, 08R505 (2006), 3 pp.

Lu, B. et al., The Physics of Ultrahigh-Density Magnetic Recording (Springer Series in Surface Sciences, 41), Chapter 2, Microstructure of Longitudinal Media, 38 pp.

Li, H.F. et al., Nanocrystallisation of an Fe44.5Co44.4Zr7B4 amorphous magnetic alloy, Philosophical Magazine, vol. 86, No. 10, Apr. 1, 2006, pp. 1355-1372.

Jeong, S. et al., Nanostructure and magnetic properties of polycrystalline FePdPt/MgO thin films, J. Appl. Phys., vol. 91, No. 10. May 15, 2002, pp. 8813-8815.

Hsu, Y.-N. et al, New Ni5Al3 Underlayer for Longitudinal Magnetic Recording Media, IEEE Transactions on Magnetics, vol. 38, No. 4, Jul. 2002, pp. 1803-1806.

Wierman, K.W. et al., RuxCr1-x/Ta underlayer for Co-alloy perpendicular magnetic recording, J. Appl. Phys., vol. 91, No. 10, May 15, 2002, pp. 8031-8033.

Lee, J.C. et al., Stability enhancement of nanopillar structure for spin transfer magnetization switching using IrMn buffer layer, J. Appl. Phys. 99, 08G517 (2006), 3 pp.

Hsiao, A. et al., The Thermal, Magnetic, and Structural Characterization of the Crystallization Kinetics of Fe88Z47B4Cu1, An Amorphous Soft Magnetic Ribbon, IEEE Transactions on Magnetics, vol. 38, No. 5, Sep. 2002, pp. 3039-3044.

Stohr, J. et al., Magnetization Manipulation in Nanostructures by Spin Currents, NSF, Div. of Condensed Matter Physics & U.S. Dept. of Energy, 14 pp.

Kong, J.H. et al, Magnetization Reversal of Co\Cu\Co Pillars by Spin-Polarized Current with Magnetic Fields, J. Korean Phys. Soc., vol. 46, No. 4, Apr. 2005, pp. 931-936.

Berger, L., Emission of spin waves by a magnetic multilayer traversed by a current, Phys. Rev. B, vol. 54, No. 13, Oct. 1, 1996, pp. 9353-9358.

Slonczewski, J.C., Current-driven excitation of magnetic multilayers, Journal of Magnetism and Magnetic Materials 159 (1996), pp. L1-L7.

Berger, L., Multilayer configuration for experiments of spin precession induced by a dc current, J. Appl. Phys., vol. 93, No. 10, May 15, 2003, pp. 7693-7695.

Huai, Y. et al., Observation of spin-transfer switching in deep submicron-sized and low-resistance magnetic tunnel junctions, Appl. Phys. Lett., vol. 84, No. 16, Apr. 19, 2004, pp. 3118-3120.

Fuchs, G.D. et al., Adjustable spin torque n magnetic tunnel junctions with two fixed layers, Appl. Phys. Lett. 86, 152509 (2005), 3 pp.

T. Sek et al.; Spin-polarized current-induced magnetization reversal in perpendicularly magnetized L10-FePt layers; Applied Physics Letters; 88, 172504 2006 ; Apr. 25, 2006.

Yingfan. Xu et al.; In situ ordering of FePt thin films with face-centered-tetragonal 001 texture on Cr100AxRux underlayer at low substrate temperature; Applied Physics Letters, vol. 80, No. 18, May 6, 2002.

S. Mangin el al.; Current-induced magnetization reversal in nanopillars with perpendicular anisotropy; Nature Materials; Mar. 2005: vol. 5.

F. J. Albert, et al.; Quantitative Study of Magnetization Reversal by Spin-Polarized Current in Magnetic Multilayer Nanopillars; Physical Review Letters; vol. 89, No. 22; Nov. 25, 2002.

Hao Meng, et al.; Current Confined Effect of Magnet Nano-Current-Channel for Magnetic Random Access Memory; The Center for Micromagnetics and Information Technology; Oct. 31, 2006.

L. Berge; Emission of spin waves by a magnetic multilayer traversed by a current; Physical Review; Oct. 1, 1996; vol. 54, No. 13.

G. D. Fuchs, et al.; Spin Torque, Tunnel-Current Spin Polarization, and Magnetoresistance in MgO Magnetic Tunnel Junctions; Physical Review Letters; PRL 96, 186603 (2006); May 12, 2006.

Jun Hayakawa; Current-Driven Magnetization Switching in CoFeB/MgO/CoFeB Magnetic Tunnel Junctions; Japanese Journal of Applied Physics; vol. 44, No. 41, 2005, pp. L 1267-L 1270.

Hao Meng, et al.; Composite free layer for high density magnetic random access memory with lower spin transfer current; Applied Physics Letters 89, 152509; Oct. 12, 2006.

Hao Meng, et al.; Low critical current for spin transfer in magnetic tunnel junctions; Applied Physics Letters; 88; Feb. 23, 2006.

G. D. Fuchs; Spin-transfer effects in nanoscale magnetic tunnel junctions, Applied Physics Letters; vol. 85, No. 7; Aug. 16, 2004.

J.C. Slonezewski; Current-driven excitation of magnetic multi-layers; Journal of Magnetism and Magnetic Materials; Dec. 19, 1995.

G. Consolo. et al.; Spin-lorque switching in Py/Cu/Py and Py/Cu/CoPt spin-valve nanopillars; Journal of Magnetism and Magnetic Materials; Mar. 23, 2007.

F. J. Albert; Spin-polarized current switching of a Co thin film nanomagnet; Appliea Physics Letters; vol. 77, No. 23; Dec. 4, 2000.

Xiaochun Zhu; Spin Torque and Field-Driven Perpendicular MRAM Designs Scalable to Multi-Gb/Chip Capacity; , vol. 42, No. 10. Oct. 2006.

C. J. Sun, et al.; Epitaxial L1o FePt magnetic thin films sputtered on Cu (001): Applied Physics Letters; vol. 82. No. 12; Mar. 24, 2003.

J. A. Katine et al.; Current-Driven Magnetization Reversal and Spin-Wave Excitations in CoCuCo Pillars; Physical Review Letters; vol. 84; Apr. 3, 2000.

* cited by examiner

MAGNETIC MEMORY SENSING CIRCUIT

CROSS REFERENCE TO RELATED APPLICATIONS

This application is a continuation-in-part of U.S. application Ser. No. 12/040,801 filed on Feb. 29, 2008, entitled "An Improved Low Resistance High-TMR Magnetic Tunnel Junction and Process for Fabrication Thereof," which is a continuation-in-part of U.S. application Ser. No. 11/674,124 filed on Feb. 12, 2007, entitled "Non-Uniform Switching Based Non-Volatile Magnetic Based Memory," which claims priority to U.S. Provisional Application No. 60/853,115 filed on Oct. 20, 2006 entitled "Non-Uniform Switching Based Non-Volatile Magnetic Based Memory"; and is a further continuation-in-part of U.S. application Ser. No. 11/678,515 filed Feb. 23, 2007, entitled "A High Capacity Low Cost Multi-State Magnetic Memory," which claims priority to U.S. Provisional Application No. 60/777,012 filed Feb. 25, 2006 entitled "A High Capacity Low Cost Multi-State Magnetic Memory"; and is a further continuation-in-part of U.S. application Ser. No. 11/739,648, filed Apr. 24, 2007 entitled "Non-Volatile Magnetic Memory with Low Switching Current and High Thermal Stability"; and is a further continuation-in-part of U.S. application Ser. No. 11/740,861, filed Apr. 26, 2007, titled "High Capacity Low Cost Multi-Stacked Cross-Line Magnetic Memory"; and is a further continuation-in-part of U.S. application Ser. No. 11/776,692, filed Jul. 12, 2007, titled "Non-Volatile Magnetic Memory Element with Graded Layer"; and is a further continuation-in-part of U.S. application Ser. No. 11/860,467 filed Sep. 24, 2007, titled "Low cost multi-state magnetic memory"; and is a further continuation-in-part of U.S. application Ser. No. 11/866,830 filed Oct. 3, 2007 entitled "Improved High Capacity Low Cost Multi-State Magnetic Memory"; and is a further continuation-in-part of U.S. application Ser. No. 11/932,940 filed Oct. 31, 2007 entitled "Current-Confined Effect of Magnetic Nano-Current-Channel (NCC) for Magnetic Random Access Memory (MRAM)," which claims priority to U.S. Provisional Application No. 60/863,812 filed Nov. 1, 2006 entitled "Novel Spintronic Device."

BACKGROUND OF THE INVENTION

1. Field of the Invention

The present invention relates generally to magnetic memory element and particularly to sensing (or reading) of and writing to the magnetic memory element and an array made of the same.

2. Description of the Prior Art

Computers conventionally use rotating magnetic media, such as hard disk drives (HDDs), for data storage. Though widely used and commonly accepted, such media suffer from a variety of deficiencies, such as access latency, the data not being randomly accessible, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (IOP) speed, decreased power dissipation and physical size and increased reliability but at a higher cost which tends to be generally multiple times higher than hard disk drives (HDDs).

Although NAND-based flash memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles. The flash-type non-volatile memories are typically capable of writing one type of data randomly (e.g. 0's), to write other types of data a larger section of the memory needs to be erased.

It is believed that NAND flash, especially multi-bit designs thereof, would be extremely difficult to scale below 45 nanometers. Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and RAM as a part of the memory in a system design. Design of different memory technology in a product adds to design complexity, time to market and increased costs. For example, in hand-held multi-media applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies such as Ovanic Ram (or phase-change memory), Ferromagnetic Ram (FeRAM), current Magnetic Ram (MRAM), Nanochip, and others to replace memories used in current designs such as DRAM, SRAM, EEPROM/NOR flash, NAND flash and HDD in one form or another. Although these various memory/storage technologies have created many challenges, such as requiring too much current or having a large cell size or not readily scalable, there have been advances made in this field in recent years. Current MRAM designs seem to lead the way in terms of its progress in the past few years to replace all types of memories in the system as a universal memory solution.

An MRAM element generally consists of a magnetic tunnel junction (MTJ) and an access transistor. A magnetic tunnel junction (MTJ) generally consists of a tunneling layer, such as one made of magnesium oxide (MgO) formed between two magnetic layers.

Electron current tunneling through the tunneling layer depends on the orientation of the two magnetic layers. If the magnetic orientations of the two magnetic layers are parallel, electrons have a relatively easy time tunneling through the tunneling layer, otherwise, tunneling is difficult and some of the electrons are reflected at the interface. Therefore, the total resistance of the MTJ is less when the directions of the magnetic orientation of the magnetic layers are parallel relative to each other. If the resistance of the MTJ is Rl (or $R_{low}$) when the magnetic directions are parallel, and Rh (or $R_{high}$) when they are anti-parallel, the relative change of resistance is defined as $(R_h-R_l)/Rl$, which is a measurement of tunneling magnetic resistance (TMR). That is, the following equation defines TMR as:

$$TMR=(Rh-Rl)/Rl \qquad \text{Eq. (1)}$$

The first time a product is manufactured, the magnetic orientations in all the MTJs are typically in the same direction, such as in a parallel state. Therefore, the resistances of all the memory elements are at $R_l$. After writing a "1" (or an active logic state, which may be considered "0" in certain cases), the resistance changes to $R_h$. Due to noise and other natural variances in the manufacturing process and write operations, the value of the resistances ($R_l$ or $R_h$) form a Gaussian distribution around certain $R_{low\_avg}$ and $R_{high\_avg}$. In reading a memory cell, which includes a memory element, its resistance is determined and based on its detected resistance, its logical state is determined as being a "0" or "1". To do so, the memory cell resistance is compared to a resistor with the average value of $Ravg=(R_{low\_avg}+R_{high\_avg})/2$. When the $R_{high}-R_{avg}$ is larger than a certain value V0 for a particular memory cell, the cell is read as "1", and when $R_{avg}-R_{low}$ is larger than V0 for a particular memory cell, the cell is read as "0". If the values are less than V0, the memory cell state is undetermined and can not be read. The V0 value is related to the sensitivity of the sense amplifier. For instance, the value of V0 is smaller for more sensitive sense amplifier.

However, one of the problems associated with the foregoing is that the value of the V0 can not be lowered indefinitely because of the presence of thermal noise as well as noise generated by the switching of signals from one state to another. This requires the value of V0 to be larger than Vnoise by several orders of magnitude.

What is needed is a circuit for reliably sensing and writing to MRAM memory cells.

SUMMARY OF THE INVENTION

To overcome the limitations in the prior art described above, and to overcome other limitations that will become apparent upon reading and understanding the present specification, the present invention discloses a design method and a corresponding structure for a magnetic storage memory device that is based on spin current-induced-magnetization-switching having reduced switching current in the magnetic memory.

Briefly, an embodiment of the present invention includes a sensing circuit having a sense amplifier circuit having a first and second nodes through which a magnetic memory element is sensed. A first current source is coupled to the first node a second current source is coupled to the second node. A reference magnetic memory element has a resistance associated therewith and is coupled to the first node, the reference magnetic memory element receives current from the first current source. At least one memory element, having a resistance associated therewith, is coupled to the second node and receives current from the second current source. Current from the first current source and current from the second current source are substantially the same. The logic state of at least one memory element is sensed by a comparison of the resistance of the at least one memory element to the resistance of the reference magnetic memory element.

In another embodiment, a magnetic memory write circuit is disclosed to include a magnetic memory element coupled to a bit line on one end and an access transistor coupled to an opposite end of the magnetic memory element and operative to select the magnetic memory element to be read or written thereto. The access transistor is further coupled to a word line, the magnetic memory element are selected to be read from or written to when the bit line and word line are activated. A first inverter has an output coupled to the bit line and an input coupled to an input of the magnetic memory write circuit and a second inverter has an input coupled to the input of the magnetic memory write circuit and further having an output and a third inverter has an input coupled to the output of the second inverter and an output coupled to the source of the access transistor and to ground.

These and other objects and advantages of the present invention will no doubt become apparent to those skilled in the art after having read the following detailed description of the preferred embodiments illustrated in the several figures of the drawing.

IN THE DRAWINGS

Figure 4:
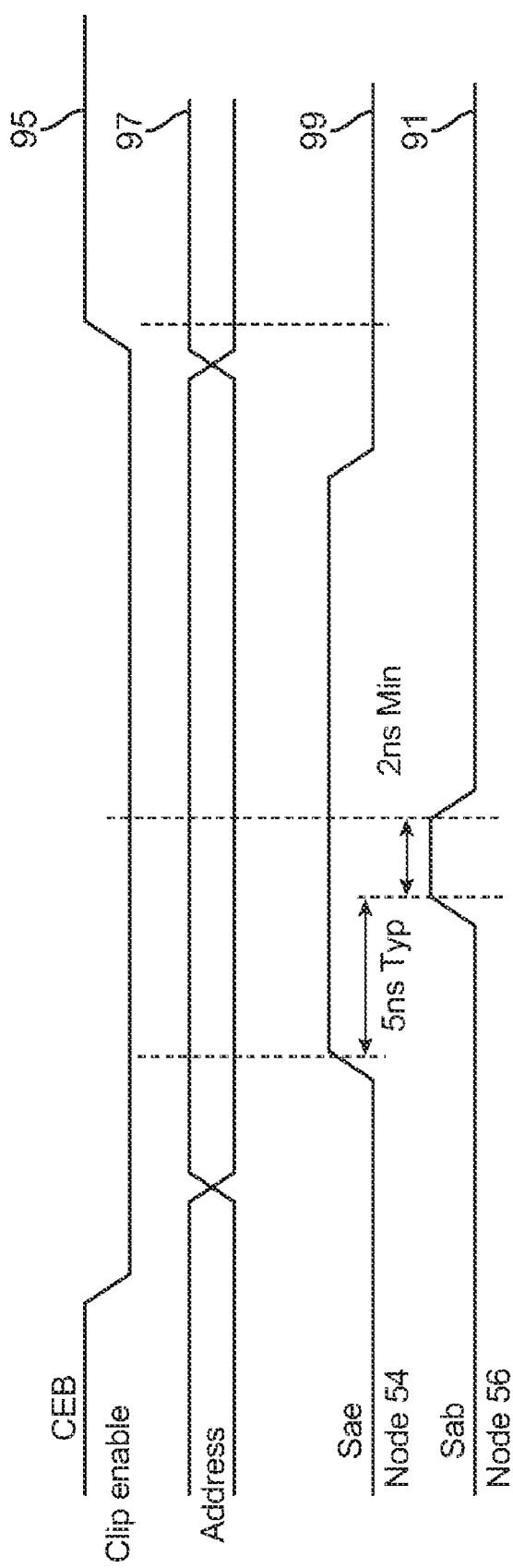

FIG. 4 shows a timing diagram of the nodes 54 and 56. The node 54 generates the signal 99 and the node 56 generates the signal 91.

Figure 5:
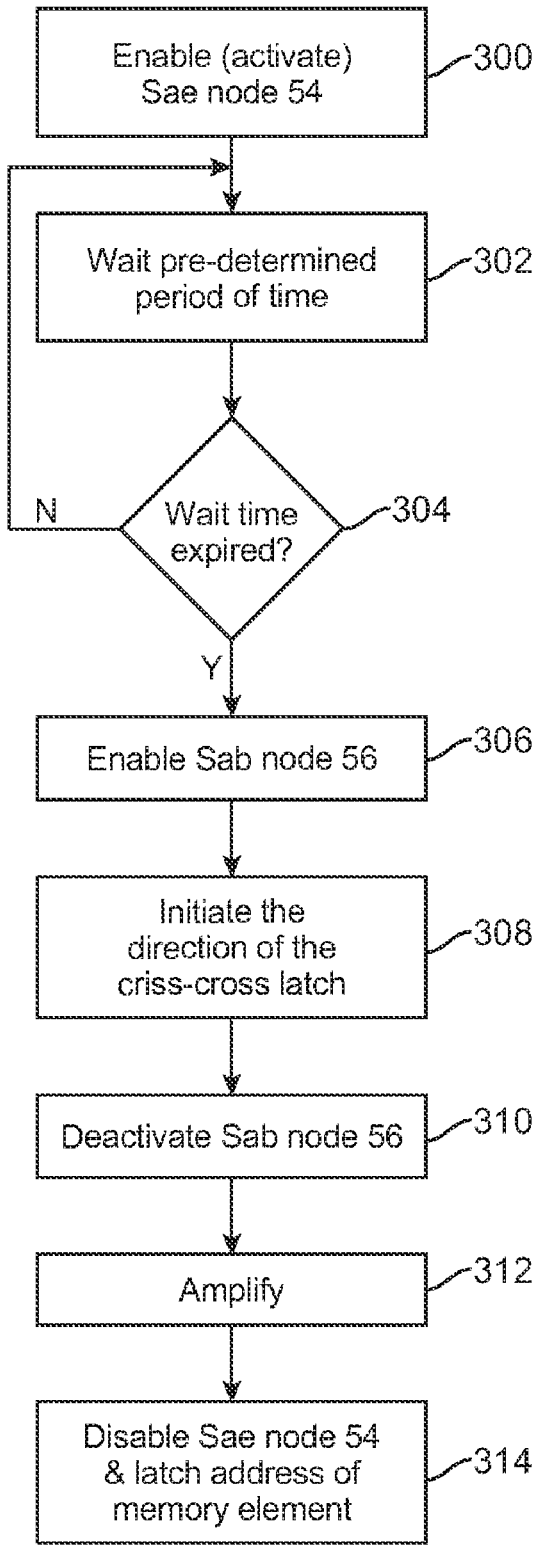

FIG. 5 shows a flow chart of the steps performed by the sense amplifier 230 when sensing a memory element such as the memory element 100.

Figure 6:
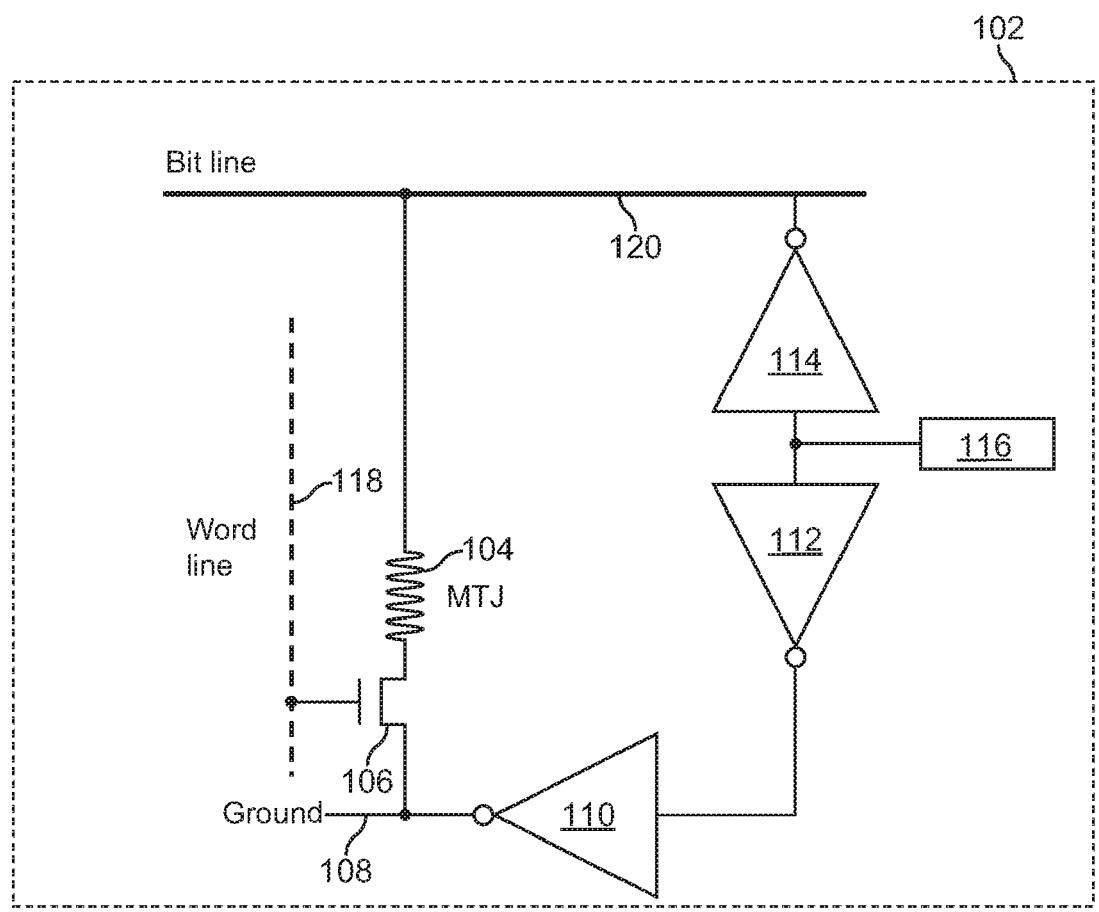

FIG. 6 shows a write circuit 102, in accordance with an embodiment of the present invention.

Figure 7:
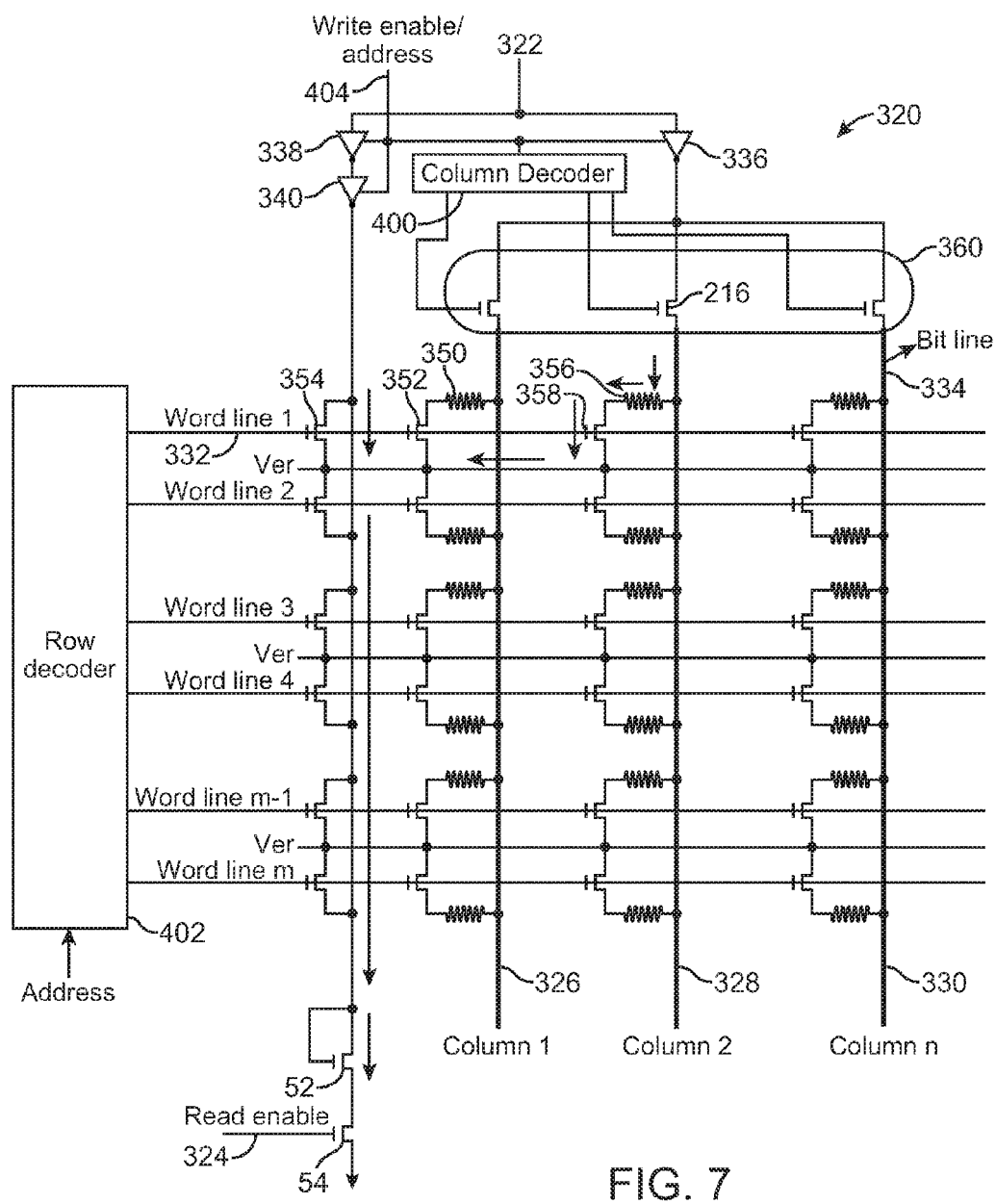

FIG. 7 shows a memory array 320 made of magnetic memory elements and including circuits for reading and writing to the same, in accordance with an embodiment of the present invention.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

It is understood that as used herein "magnetic memory element", "memory element", "reference magnetic memory element" or "reference memory element", or "magnetic random access memory (MRAM)" all refer to magnetic memory that is made of MTJ. Various embodiments of the structure used for a memory element are shown and discussed in the following documents:

U.S. application Ser. No. 11/674,124, filed Feb. 12, 2007, titled "Non-Uniform Switching Based Non-Volatile Magnetic Based Memory" by Ranjan et alia, U.S. application Ser. No. 11/678,515, Filed Feb. 23, 2007, titled "A High Capacity Low Cost Multi-State Magnetic Memory" by Ranjan et alia, U.S. application Ser. No. 11/739,648 Filed Apr. 24, 2007, titled "Non-volatile Magnetic Memory With Low Switching Current and High Thermal Stability" by Ranjan et alia, U.S. application Ser. No. 11/776,692, filed Jul. 12, 2007, titled "Non-Volatile Magnetic Memory Element with Graded Layer" by Ranjan et alia, U.S. application Ser. No. 11/740,861, filed Apr. 26, 2007, titled "High Capacity Low Cost Multi-Stacked Cross-Line Magnetic Memory" by Ranjan et alia, U.S. application Ser. No. 60/863,812, filed Nov. 1, 2006, titled "Novel Spintronic Device" by Wang, U.S. application Ser. No. 11/932,940 filed Oct. 31, 2007 titled "Current-Confined Effect Of Magnetic Nano-Current-Channel (NCC) For Magnetic Random Access Memory (MRAM)" by Wang;

U.S. application Ser. No. 11/866,830 filed Oct. 3, 2007, titled "Improved High Capacity Low Cost Multi-State Magnetic Memory" by Ranjan et alia;

U.S. application Ser. No. 11/860,467 filed Sep. 24, 2007, titled "Low cost multi-state magnetic memory" by Ranjan et alia; and U.S. application Ser. No. 12/040,801, filed on Feb. 29, 2008, titled "An Improved Low Resistance High-TMR Magnetic Tunnel Junction and Process For Fabrication Thereof" by Ranjan, the disclosures of which are incorporated herein by reference as though set forth in full.

In various embodiments of the present invention, a reference magnetic memory element is used to read magnetic memory elements. The reference magnetic memory element is similar to any one of the magnetic memory elements being read or written and is therefore an MRAM element and ideally has associated therewith a resistance value of $R_{avg} = (R_{low\_avg} + R_{high\_avg})/2$, which is then used to as a reference resistance in reading the MRAM memory elements. As noted earlier, the MRAM memory elements each include an MTJ. However, since the exact shape of the MTJ resistance distribution when the memory elements are first manufactured remains unknown, making a memory element that has a resistance value represented by:

$$R_{avg} = (R_{low\_avg} + R_{high\_avg})/2 \qquad \text{Eq. (2)}$$

is difficult. $R_{avg}$ is the average resistance of the low resistance values $R_{low\_avg}$ and the average of the high resistance values $R_{high\_avg}$. Thus, in place of $R_{avg}$, which represents more of an exact average resistance value, a resistance value of $R_v$ is used in accordance with the following relationship:

$$R_v = (R_{low} + R_{high})/2 \qquad \text{Eq. (3)}$$

$R_v$ is obviously different from $R_{avg}$ in that it is the average of low and high resistance values rather than an average of the same, therefore, causing more difficulty in sensing (or reading of the memory elements).

Figure 1:
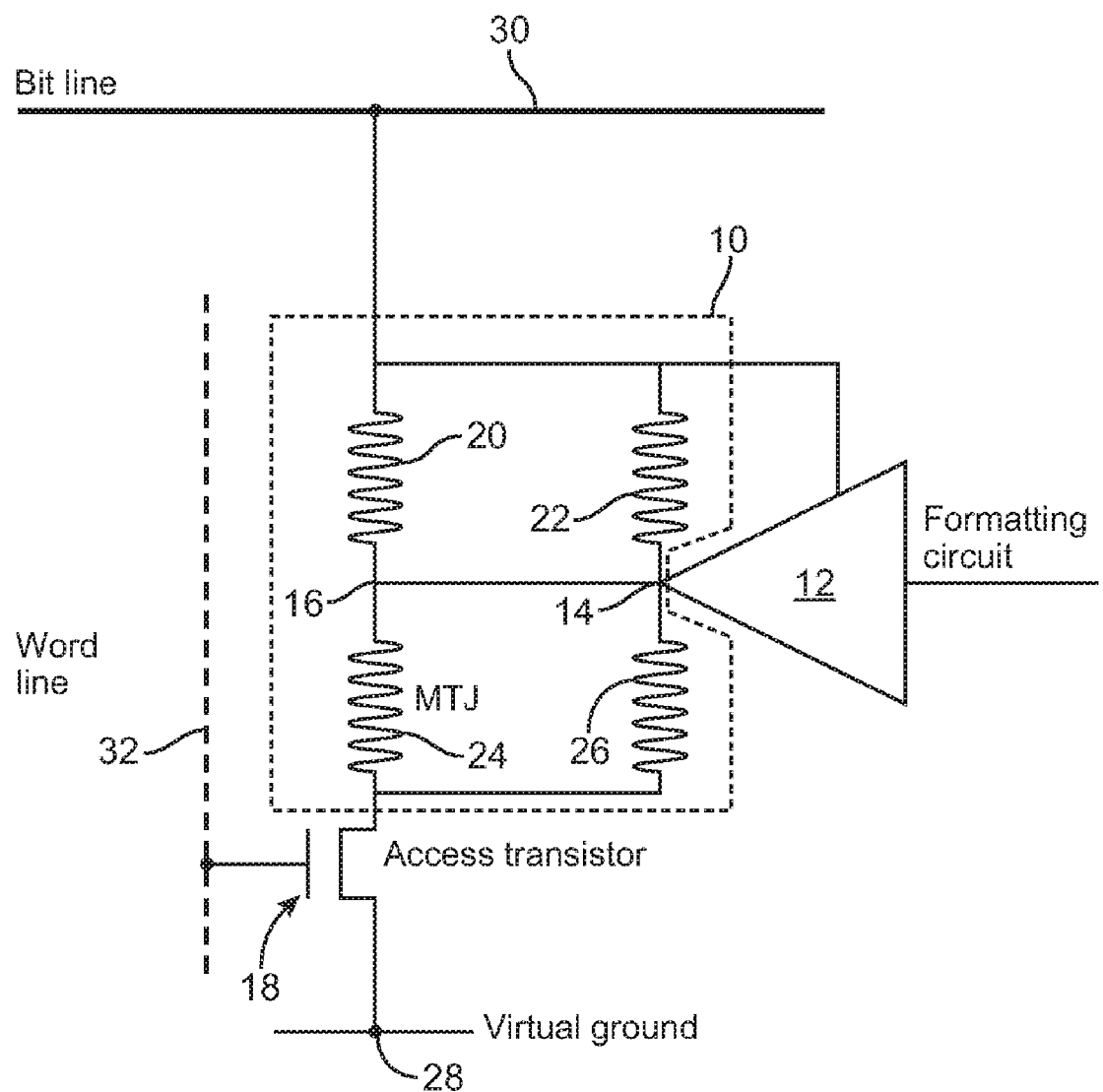
FIG. 1 shows the structure of a reference magnetic memory element, in accordance with an embodiment of the present invention.

Referring now to FIG. 1, the structure of a reference magnetic memory element 10, in accordance with an embodiment of the present invention. The reference element 10 is shown to include MTJs 20, 22, 24 and 26 and has a resistance value represented by $R_v$ of Eq. (3), in accordance with an embodiment of the present invention. The MTJs 20, 22, 24 and 26, initially each have a resistance value of $R_{low}$. This is because the first time MRAM elements are manufactured, their resistances are set to $R_{low}$.

MTJs 20 and 22 are coupled together in parallel and the MTJs 24 and 26 are coupled together in parallel. The MTJ 20 is coupled, in series, with the MTJ 24, at a node 16, and the MTJ 22 is coupled, in series, with the MTJ 26 at a node 14.

A formatting circuit 12 is shown coupled, at its output, to the MTJs 22 and 24 at the node 14. The MTJs 20 and 26 are coupled to the formatting circuit at its control gate. The formatting circuit 12 functions as an amplifier which pumps programming current through the MTJs 20 and 22, changing their resistance values to $R_{high}$. The MTJs 24 and 26 are connected at ends (or nodes) opposite to the nodes 16 and 14, respectively, to a source of an access transistor 18. The gate of the access transistor 18 is coupled to the word line 32 and the drain of the access transistor 18 is coupled to virtual ground. Virtual ground, as used herein, refers to a node that is maintained at a steady reference potential (or voltage level) (during read operations) while fluctuating between at least two states (or voltage levels) during write operations. The MTJs 20 and 22 are coupled at nodes opposite to the nodes 16 and 14, respectively, to a bit line 30.

In operation and before the memory elements are tested, a formatting operation is performed by activating the formatting circuit 12, at its input thereby causing programming of the MTJ 20 and 22 under average conditions, which results in increasing the resistance values of the MTJs 20 and 22 to $R_{high}$. The collective resistance value of the MTJs 20 and 22 is represented by the average of $R_{low}$ and $R_{high}$ or the following equation:

$$R_{avg} = (R_{low} + R_{high})/2 \qquad \text{Eq. (4)}$$

Tunneling magnetic resistance (TMR) is defined as:

$$TMR = (R_{high} - R_{low})/R_{low} \qquad \text{Eq. (5)}$$

Relative to TMR, the $R_{high}$ is defined as:

$$R_{high} = R_{low} * (1 + TMR) \qquad \text{Eq. (6)}$$

and $R_{avg}$ is defined as:

$$R_{avg} = R_{low} * (1 + TMR/2) \qquad \text{Eq. (7)}$$

During a read operation, the resistance values of the selected MTJ within a memory array (or the MTJ that is selected to be read) is compared to the average resistance formed by the MTJs 20, 22, 24 and 26. If the resistance value of the selected MTJ is higher than $R_{avg}$, the result is a logical state '1', and if it is less than $R_{avg}$ the result is logical state '0', or vice versa.

The average resistance, while perhaps not representing the exact average, as the average changes due to manufacturing and other factors, represents a resistance value that is close to an average of the high and low resistances. As the high and low resistances may not be absolute in and of themselves, with a variance associated with each, the average resistance, using the method and apparatus of the embodiments of the present invention, is close enough to a middle range so as to avoid mis-write or mis-read.

As previously noted, a magnetic memory element includes an MTJ made of a tunneling (or barrier) layer sandwiched between two magnetic layers. One of the magnetic layers is typically a free layer whose magnetic orientation transitions from one that is parallel to that of the other magnetic layer (known as the fixed layer) to one that is anti-parallel to that of the fixed layer. The thickness of the tunneling layer and the physical size of the memory element, upon which TMR is based, generally determine the resistance values to which the resistors 20-26 should be set. This is evidenced by the equations above. As an example, where the thickness of the tunneling layer is 10 to 15 A and the physical size of the memory element is 0.1 to 0.2 u2, a $R_{high}$ resistance value is 1400 ohms and a $R_{low}$ resistance value is 600 ohms with an average resistance of 1000 ohms. Therefore, the resistance of a magnetic memory element that is to be read is compared to 1000 ohms and if it is higher, for example, the memory element may be declared as being at a high logic state and if it is lower than 1000 ohms, the memory element may be declared as being at a low logic state. Thus, rather than simply using a reference voltage to compare to in determining the logical state of a memory element, as done by prior art techniques, in one embodiment of the present invention, the average value of the resistance of two MTJs are used to compare to the resistance of the MTJ (or memory element) being read.

Figure 2:
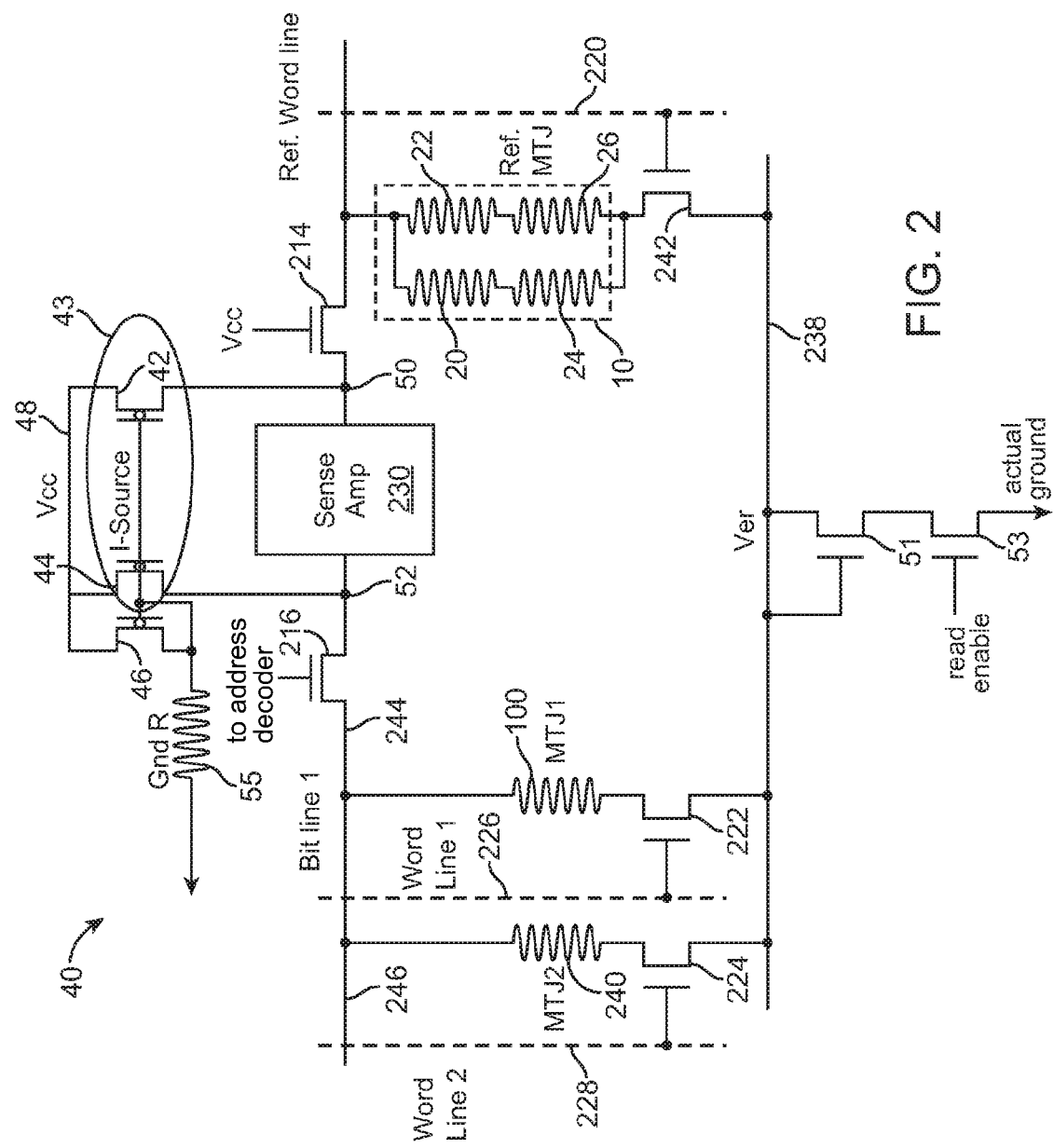
FIG. 2 shows a sensing circuit, in accordance with an embodiment of the present invention.

FIG. 2 shows a magnetic memory sensing circuit 40 for sensing (or reading) the state of a magnetic memory element 100, which is made of a MTJ or the state of the magnetic memory element 240, which is also made of a MTJ, using the reference memory element 10, in accordance with an embodiment of the present invention. As used herein, a memory element includes a MTJ and a memory cell includes a memory element and a corresponding access (or select) transistor.

Memory element 100 and memory element 240 may be each made of any of the memory elements shown and discussed in the following patent document:
memory element are shown and discussed in the following documents:
U.S. application Ser. No. 11/674,124, filed Feb. 12, 2007, titled "Non-Uniform Switching Based Non-Volatile Magnetic Based Memory" by Ranjan et alia,
U.S. application Ser. No. 11/678,515, Filed Feb. 23, 2007, titled "A High Capacity Low Cost Multi-State Magnetic Memory" by Ranjan et alia,
U.S. application Ser. No. 11/739,648 Filed Apr. 24, 2007, titled "Non-volatile Magnetic Memory With Low Switching Current and High Thermal Stability" by Ranjan et alia,
U.S. application Ser. No. 11/776,692, filed Jul. 12, 2007, titled "Non-Volatile Magnetic Memory Element with Graded Layer" by Ranjan et alia,
U.S. application Ser. No. 11/740,861, filed Apr. 26, 2007, titled "High Capacity Low Cost Multi-Stacked Cross-Line Magnetic Memory" by Ranjan et alia,
U.S. Application No. 60/863,812, filed Nov. 1, 2006, titled "Novel Spintronic Device" by Wang,
U.S. application Ser. No. 11/932,940 filed Oct. 31, 2007 titled "Current-Confined Effect Of Magnetic Nano-Current-Channel (NCC) For Magnetic Random Access Memory (MRAM)" by Wang;
U.S. application Ser. No. 11/866,830 filed Oct. 3, 2007, titled "Improved High Capacity Low Cost Multi-State Magnetic Memory" by Ranjan et alia;
U.S. application Ser. No. 11/860,467 filed Sep. 24, 2007, titled "Low cost multi-state magnetic memory" by Ranjan et alia; and
U.S. application Ser. No. 12/040,801, filed on Feb. 29, 2008, titled "An Improved Low Resistance High-TMR Magnetic Tunnel Junction and Process For Fabrication Thereof" by Ranjan.

In FIG. 2, the sensing circuit 40 is shown to include a sense amplifier circuit 230 coupled to a decoding transistor 214 and further coupled to a decoding transistor 216, at their source. The drain of the transistor 214 is shown coupled to the reference memory element (MTJ) 10 and serves as a reference bit line. The reference memory element 218 is further shown coupled to a transistor 242 at the drain of the transistor 242. The gate of the transistor 242 forms a reference word line 220 and the source of the transistor 242 forms the virtual ground (Ver) 238, which is shown coupled to the source of the transistor 222.

The drain of the transistor 222 is shown coupled to the memory element 100 and an opposite end of the memory element 100 is shown coupled to the drain of the transistor 216 forming the bit line 1 244. The source of the transistor 222 is shown coupled to the source of the transistor 224 and to the source of the transistor 242 forming Ver 238. The gate of the transistor 224 is shown to form the word line 2 228. The drain of the transistor 224 is shown coupled to the memory element 240, which on an opposite end thereto, forms the bit line 2 246.

Ver 238 is shown coupled to the drain of the transistor 51, which has its gate coupled to the same, i.e. Ver 238. The source of the transistor 51 is shown coupled to the drain of the transistor 53, which has its source coupled to (actual) ground. The gate of the transistor 53 is coupled to the read enable signal 324, which serves to initiate a read operation. The gate of the transistor 53, 60 goes high during read operation and is grounded during write operation of the selected MTJ.

The gate of transistor 216 is coupled to an address decoder (not shown). In some embodiments, the transistor 216 is part of an address decoder, which selects which memory element is to be read or written thereto. In the embodiment of FIG. 2, the transistor 216 might select the memory element 100 while another transistor of the address might select the memory element 240. The gate of the transistor 214 is shown coupled to Vcc (or a high state). The transistors 52, 54, 216, 214, 222, 221 and 242 are each of the NMOS type of transistors Transistors 42, 44 and 46 are shown coupled in parallel relative to each other with the drains thereof being coupled to high voltage defining a power supply (or Vcc). The drains of transistors 42 and 44 are each shown coupled to either sides of the sense amplifier 230. That is, the drain of the transistor 42 is shown coupled between the sense amplifier 230 and the drain of the transistor 214 at reference magnetic memory element sensing node 50 and the drain of the transistor 44 is shown coupled between the sense amplifier and the source of the transistor 216 at magnetic memory element sensing node 52. The drain of the transistor 46 is shown coupled to the resistor 55, which on an apposite end thereof, is shown coupled to (actual) ground.

The sense amplifier 230 senses potential or voltage levels at the nodes 50 and 52 and compares them to determine which has a higher potential which is related to the higher resistance of the MTJs. This is done because of the well-known relationship between voltage (V) being resistance (R) multiplied by current (I). If the voltage at 52 is determined to be higher than that of the voltage at 50, the resistance of the memory element 100 is then known to be higher than that of the memory element 10, thus, declaring the memory element 100 to be at high state. Otherwise, if the voltage at node 52 is determined to be lower than that at node 50, the memory element 100 is determined to be at low state. It is understood that the opposite may be implemented in that the voltage at node 52 being higher than that of node 50 yielding a low state and the voltage at node 52 being lower than that of the mode 50 yielding a high state.

The transistors 42 and 44 and 46 function as current sources, providing substantially the same amount of current through the reference memory element 10 and each of the memory elements 100 and 240. That is, the current generated by the current source (or transistor 42) to the memory element 100 or the memory element 240 is substantially identical, in amount, to the current generated by the current source (or transistor) 42 to the memory element 10. The current source 43 is shown made of the transistors 42, 44 and 46 and their connections to each other.

In one embodiment of the present invention, the logical state of each of the memory elements 100 and 240 is easily measured by comparing the resistance of each to that of the reference memory element 10. This is done because the resistance of the reference memory element 10 is known, as previously discussed, and being that the current supplied to the reference memory element 10 and each of the memory elements is the same, the resistance of the latter is determined relative to the former. For example, if the resistance of the memory element 100 is determined to be higher than that of the reference memory element 10, the logic state of the memory element 100 may be determined as being 'high' or '1', whereas, if the resistance of the memory element 100 is determined to be lower than that of the reference memory element 10, the logic state of the memory element 100 may be determined as being 'low' or '0', alternatively, the reverse of these states may be determined. It is understood that while two memory elements 100 and 240 are shown in FIG. 2, any number of memory elements may be employed and their states read in accordance with the foregoing.

The transistors 51 and 53 are formed between the memory elements and actual ground because the amount of voltage generated due to the current flowing through the MTJ is very low. This is because the currents generated by the current sources are substantially approximately in the micro amperes range. Since the resistance of the MTJs is approximately in the kilo ohms range, the voltage generated across the MTJs is in the milli-volts range. The threshold of the sensing elements in the sense amplifier is larger than this. The transistor 51 is employed to bias the voltage to a larger value in order to activate the transistor in the sense amp. The threshold of the transistor 51 is Vt, so that the voltage at the gate of the sensing element being read is Vt+V0, with V0 being the voltage generated by the MTJ resistor.

The function of the transistor 46 and the resistor 55 is to set the current value for the current sources 42 and 44. That is, the resistance value of the resistor 55 determines the amount of current to be supplied by each the current sources 42 and 44. Ideally, an identical amount of current is supplied by each of the current sources 42 and 44 to the memory element 10 and the memory elements to be read (or sensed).

During a read (or sensing) operation, the sense amplifier circuit 230 compares the resistance of the memory element 100 (of the selected cell) to the resistance of the reference memory element 10. The resistance of the cell 10 is designed to be (R1+R2)/2, where R1 is the resistance of the memory element 100 in a low state and R2 is the resistance of the memory element 100 in high state. The high and low states are based on the description provided above where the low state has a characteristic of being at least half of the resistance of that of the high state. The magnetic orientation of the fixed and the free layers, i.e. the two magnetic layers of the MTJ of the memory cell being read, are parallel relative to each other at a low state and at a high state, the magnetic orientation of the fixed and free layers are anti-parallel relative to each other.

In one embodiment of the present invention, the sense amplifier 230 is a bi-stable latch or any such device, which flips between logic states based on the state of the resistance. For example, if resistance is low, the state will be that of a low state and if resistance is high, the state will be that of a high state.

It should be noted that the magnetic memory elements 100 and 240 are two of many magnetic memory elements coupled to bit line 244. The transistors 222 and 224 are used to select one of these magnetic memory elements based on the selection of one of the word lines 226 or 228. When a word line is selected, it is biased with the appropriate potential required to turn on the selected transistors. When one of the transistors 222 or 224 is selected, the memory element 100 is caused to be coupled to the circuit 230, at 231, through the transistor 216, which as a decoder circuit. At the same time the reference memory element 10 is selected by the transistor 242 and the word line 220. Thereafter, current flows through the selected transistors, i.e. transistor 222 or 224. The current flowing through the reference memory element 10 is always the same, while current flowing through the selected memory elements, such as the memory element 100 depends on the state of that memory element. That is, if the memory element's state is high, its associated resistance (R) is high with respect to the reference memory elements. Thereafter, less current flows through the selected memory elements than the reference memory element 218, causing the sense amplifier circuit 230, at 233, to enter a high state with respect to that of 233. On the other hand, if the selected memory element is at a low state and has low resistance, its current is high with respect to that of the reference memory element 218 and the voltage at 231 drops. In this manner, the voltage at 231 determines the state of the selected memory element.

The current provided by the current source 43 is at least, in part, controlled by the resistance value of the resistor 50. Programming or writing of the memory cells 240 or 100 is also done by forcing high current through the magnetic memory cells being read, however, the read current can not be too high. High read currents can cause undesirable programming of the memory cells (or memory elements), which is commonly referred to as "read disturbance". Therefore, the read current needs to be below a certain critical current. This critical current depends on the MTJ size. In an exemplary embodiment, the read current is less than 40 uA (micro amps).

As currents flows through the memory cell and the reference memory cell, certain amount of voltage appears at the two ends of the sense amplifier circuit 230. If the MTJ is programmed to a high resistance value ($R_{high}$), the voltage on the MTJ side of the sense amplifier 230, such as the voltage of the memory cell 100, is higher than the voltage of the other side of the sense amplifier, such as the side with the reference memory element 10, by the following difference voltage (DV):

$$DV = Iread*(R_{high} - R_{avg}) = Iread*R_{low}*TMR/2 \qquad \text{Eq. (8)}$$

If the memory element being read is programmed to a low logical state, such as '0', the voltage on of the sense amplifier circuit 230 side that has the memory element being read, such as the side having the memory element 100 is lower by:

$$DV = Iread*(R_{low} - R_{avg}) = Iread*R_{low}*TMR/2 \qquad \text{Eq. (9)}$$

The typical values for TMR, Iread and $R_{low}$ are 1, 40 uA and 1 Kilo Ohms, respectively. Therefore a typical DV is approximately 20 milli Volts (mV). As earlier indicated, the resistance values of the MTJ in a memory product are not the same all the time, partly due to varying conditions under which such products are manufactured. For example, the thickness of the tunneling layer as well as the size of the memory element would vary the characteristics of the memory elements.

Thus, the resistance values of the MTJ in a memory product generally follow a Gaussian distribution with highs and lows. This effectively reduces the DV in reading of different cells under different conditions. Therefore, the product requires a sensitive sense amplifier circuit, such as the sense amplifier 230. A sensitive amplifier circuit however, can undesirably amplify noise and disturbances of the circuit. To overcome this problem, sensing is slightly delayed, allowing undesirable disturbances caused by switching of signals to subside.

Figure 3:
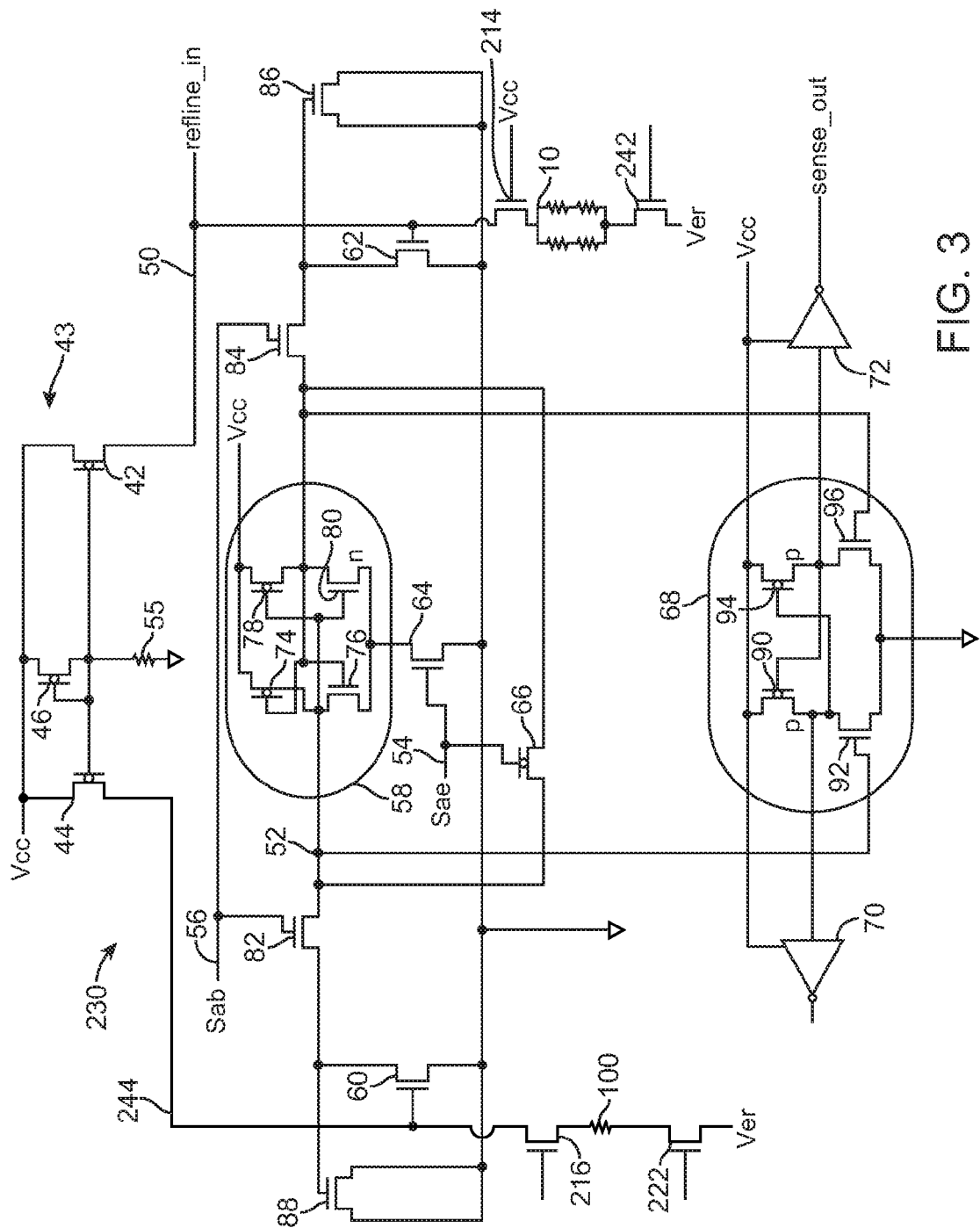
FIG. 3 shows relevant details of the sense amplifier circuit 230, in accordance with an embodiment of the present invention.

FIG. 3 shows relevant details of the sense amplifier circuit 230, in accordance with an embodiment of the present invention. The sense amplifier 230 is shown coupled to the current sources 42 and 44 and to the reference memory element 10 and the memory element 100. It is understood that more memory elements may be coupled to the sense amplifier 230 than that shown in FIG. 3.

The sense amplifier 230 is shown to include transistors 88, 60, 82, 66, 64, 84, 62 and 86 and the criss-cross latch 58 and the amplifier circuits 68, 70 and 72. The criss-cross latch 58 is shown to include transistors 74, 76, 78 and 80 and the amplifier circuit 68 is shown to include transistors 90, 92, 94 and 96. Criss-cross latch 58 is well known as are the amplifiers 68, 70 and 72. However, to overcome the problem of undesirable amplification of noise and disturbances caused by the switching of signals associated with the criss-cross latch 58, the sense amplifier 230 advantageously slightly delays sensing of the voltages of the reference memory element and the memory element to be read to allow for the disturbances to subside before beginning sensing.

The transistors 74, 78, 90, 94, 46 and 66 are generally p-type transistors and the transistors 92, 96, 86, 62, 84, 80, 76, 82 and 60 are generally n-type transistors. In FIG. 3, the gate of the transistor 88 is shown coupled to the source of the transistor 60. The source and drain of the transistor 88 are shown coupled to actual ground The A node 56 is shown coupled to the drain of the transistor 82 and the drain of the transistor 60 is shown coupled to ground. The node 52 is further shown coupled to the drain of the transistor 76 and to the source of the transistor 74. The drain of the transistor 60 are shown coupled to ground. The source of the transistor 60 is shown coupled to the drain of the transistor 82. The source of the transistor 82 is shown coupled to the node 52 and its gate is shown coupled to a Sab node 56. The source of the transistor 66 is shown coupled to the node 52, and its drain is shown coupled to the node 50 and its gate is shown coupled to a node Sae 54. The gate of the transistor 64 is shown coupled to the node 54 and its drain is shown coupled to actual ground and its source is shown coupled to the respective sources of each of the transistors 80 and 76. The source of the transistor 84 is shown coupled to the node 50, its drain is shown coupled to the source of the transistor 62 and its gate is shown coupled to the node 56. The source and drains of the transistor 86 are shown coupled to actual ground and its gate is shown coupled to the drain of the transistor 84.

The drain of the transistor 74 is shown coupled to VCC and its source is shown coupled to the node 52 and its gate is shown coupled to the node and the source of the transistor 78. The source of the transistor 76 is shown coupled to the node 52 and the gate of the transistor 76 is shown coupled to the gate of the transistor 74 and the drain of the transistor 76 is shown coupled to the source of the transistor 64. The gate of the transistor 80 is shown coupled to the node 52, its drain is shown coupled to the node 50, its source is shown coupled to the source of the transistor 64. The source of the transistor 78 is shown coupled to Vcc, its gate is shown coupled to the node 52 and to the gate of the transistor 80 and its drain is shown coupled to the node 50. The gate of the transistor 74 is shown coupled to the node 50, its drain is shown coupled to the node 52 and its source is shown coupled to Vcc.

While the transistors 46, 42 and 44 are shown to be P-type transistors in FIG. 3, they may be of N type, in alternative embodiments. In fact, any type of CMOS or bipolar transistor may be used as these transistors. Alternatively, another type of current source may be employed. It is however desirable to have the current provided by each of the transistors 42 and 44 be substantially equal. In one embodiment of the present invention, the current produced by each one differs by 10% from the other one The drain of the transistor 90 is shown coupled to Vcc, its source is shown coupled to the input of the amplifier 70 and its gate is shown coupled to the input of the amplifier 72. The drain of the transistor 94 is shown coupled to the Vcc and its gate is shown coupled to the input of the amplifier 70 and its source is shown coupled to the amplifier 72. The drain of the transistor 92 is shown coupled to the input of the amplifier 70, its gate is shown coupled to the node 52 and its source is shown coupled to ground. The drain of the transistor 96 is shown coupled to the input of the amplifier 72, its gate is shown coupled to the node 50 and its source is shown coupled to ground.

The amplifier 68 amplifies the output of the criss-cross latch 58 and one of the amplifiers 70 or 72 acts to further amply the output of the criss-cross latch 58. Use of both amplifiers helps to balance the two sides of the criss-cross latch 58 although in alternative embodiments, a single amplifier may be employed. Additionally, the amplifiers 68, 70 and 72 may be one amplifier in other embodiments. It is understood that other combinations of amplifiers may be employed.

In operation, during sensing or reading of a memory element, such as the memory element 100, the latter is advantageously sense not immediately, rather a delay is introduced prior to the time the sense amplifier 230 starts reading. Namely, the address of the memory element to be read is not latched (or captured) until some time after the reading operation starts. This is done by delaying activation of the sense amplifier 230. The delay is a design choice an in an exemplary embodiment is in the order of a couple of nano seconds.

In an exemplary embodiment, upon selection of the memory element 100 by the decoder 216 through the bit line 244, after a predetermined delay, the sense amplifier 230 is activated by raising the voltage at each of the nodes Sab 56 and Sae node 54. The Sae node 54, when activated, causes the activation of the criss-cross latch 58, which stays activated during the remainder of the read operation. Activation of the Sab node 56 causes coupling of the criss-cross latch 58 to the transistors 60 and 62. As earlier indicated, the node 56 is activated for a short period of time, such as a couple of nano seconds. While the node 56 is high (or activated), the two transistors 60 and 62 pull on the different sides of the criss-cross latch 58. That is, the transistor 60 pulls the node 52 and the transistor 62 pulls the node 50. The node with the higher voltage pulls its side of the criss-cross latch 58 toward ground. This makes the criss-cross latch 58 unbalanced with each of the nodes 50 and 52 being at voltage levels different than one another, in fact, when one node raises in potential by a certain amount, the other node lowers in potential by substantially the same certain amount. This trend continues even after the node 56 is deactivated, and one side of the criss-cross latch 58 eventually is driven to ground, indicating the memory element with the higher potential and therefore higher resistance. Accordingly, the potential of each of the nodes 52 and 50 is compared by the criss-cross latch 58 and the result is amplified by amplifiers and ultimately latched. For example, the amplifiers 68 and 72 amplify the signals to solid 0s and 1s.

In summary, in an exemplary embodiment, a memory element and a reference memory element are selected through a decoder. The current sources to each are also activated. The voltages generated by the currents flowing through the memory element and the reference memory element are applied to the gates of the transistors 60 and 62, respectively.

FIG. 4 shows a timing diagram of the nodes 54 and 56. The node 54 generates the signal 99 and the node 56 generates the signal 91. An enable signal, chip enable (CEB) 95 activates a chip or device including an array of memory elements having MTJs, such as the memory elements 100 and 240. Address signals 97 carry the address of the memory element to be sensed.

In one embodiment of the present invention, the decoder transistors 216 and 214 are a part of the address logic that are selected by the address 97 although it is understood that these transistors are two among many others.

After the selection of a memory element by activation of the signal 95 and the indicated address on the address signals 97 the desired memory element is selected, the sense amplifier 230 is activated by raising the voltages at the node 54 followed by raising the voltage at the node 56 for a short time. In an exemplary embodiment, the node 56 is raised or activated 5 nano seconds after activation of the node 54. Activation of the node 56 causes coupling the criss-cross latch 58 of the sense amplifier 230 to the transistors 60 and 62. The node 56 remains activated only for a short time, such as a couple of nano seconds, during which time, the two transistors 60 and 62 pull on the different sides of the criss-cross latch 58 to start the latching process. The criss-cross latch 58 is also known as a "cross-coupled latch".

FIG. 5 shows a flow chart of the steps performed by the sense amplifier 230 when sensing a memory element such as the memory element 100. At step 300, the node 54 is enabled (or activated) and then a predetermined period of time is awaited at 302 and 304, an example of such time is 5 nano seconds. Then the node 56 is enabled. This initiates the direction of the criss-cross latch 58 from the balanced position, i.e. the voltages at each of its sides are off with respect to each other. Next, at step 310, the node 56 is deactivated after which the output of the criss-cross latch 58 is amplified at step 312 and thereafter, the node 54 is disabled and the address of the memory element to be read is latched (or captured or stored).

The time period from enabling the node 56 at step 306 to deactivating it at step 310 is fairly short. This initiates the movements of two sides of the criss-cross latch. When the movements start, they will continue autonomously. FIG. 6 shows a magnetic memory write circuit 102, in accordance with an embodiment of the present invention. The write circuit 102 is a circuit for writing to the magnetic memory element 104, made of a MTJ and is shown to include the memory element 104, an access transistor 106 and the inverters 110-114. Data to the memory element 104 is written at the node 116, in accordance with a method and apparatus of the present invention.

The access transistor 106 is shown to be coupled to the word line 118 at its gate and to virtual ground 108 at its source and to one side of the memory element 104 at its drain. At an opposite side thereof, the memory element 104 is shown coupled to the bit line 120. The memory element 104 and the access transistor 106 collectively comprise a magnetic memory cell. The inverter 114 is shown to receive data at node 116 at its input, which is also coupled to the input of the inverter 112. The output of the inverter 114 is shown coupled to the bit line 120 and the output of the inverter 112 is shown coupled to the input of the inverter 110. The output of the inventor 110 is shown coupled to ground 108 and the source of the transistor 106.

Virtual ground 108 fluctuates between states (or voltage levels ground and Vcc) depending on the logical state being written. That is, it is driven, for example, to a logical state '1', in the case where logical state '1' is being written (or programmed) and it is driven to a state '0', in the case where logical state '0' is being written. Similarly, bit line 120 is driven to a different voltage level, dictating a particular logical state, depending on the logical state being programmed. For example, when programming logical state '1', bit line 120 is driven to logical state '0', in the embodiment of FIG. 6, and when programming logical state '0', bit line 120 is driven to logical state '1'.

The high resistance of the memory element 104 is represented by an active or high logic state "1" and is indicative of the two magnetic layers of its MTJ being in opposite orientation relative to each other. If the two magnetic layers have the same orientation, then the resistance of the memory element 104 is low and this is represented by an inactive or logical state "0". Originally all memory elements are in the "0" state (their two magnetic layers have magnetic moments in parallel). To have the memory element 104 take on a logical state, which is commonly referred to as writing to the memory element, which is, for example a "1" or high logical state, current need be forced to flow from the lower magnetic layer (or fixed layer) of the MTJ toward the top magnetic layer, or the free layer. A state of "1" appears as the data to be written at node 116. Conversely to write "0" current need be forced from the top magnetic layer (free layer) of the memory element 104's MTJ toward its lower magnetic layer (fixed layer).

The write circuit 102 accomplishes the foregoing writing in the following manner. When data, as "1", appears at node 116, the output of the inventor 112 is "0" and the output of inverter 110 is "1", therefore, virtual ground 108 is at a high or active or "1" state. In the meanwhile, the output of the inverter 114 is "0", thus, the bit line 120 is "0" thereby forcing current from the lower magnetic layer of the memory element 104 to its top magnetic layer. When the data at node 116 is "0" or the memory element 104 is to be programmed or written to an inactive state, the reverse occurs and the output of the inverter 112 is "1" causing the output of the inverter 110 or the ground 108 to be "0". In the meanwhile, the output of the inverter 114 is "1" and therefore the bit line 120 is "1" thereby forcing current to flow from the top magnetic layer of the memory element 104 to its lower magnetic layer.

It is understood that the inverters 110-114 can be replaced with any suitable circuit or structure accomplishing an inversion function.

FIG. 7 shows a memory array 320 made of magnetic memory elements and including circuits for reading and writing to the same, in accordance with an embodiment of the present invention. It is understood that the memory element 320 represents a portion of a potentially larger memory array made of additional memory elements. In one embodiment, the array 320 is 4 kilobytes by 16 bits. Furthermore, memory arrays, stacked on top of each other, with each stack including one of more of the memory array 320 are contemplated. Such memory arrays may form three-dimensional arrays.

In FIG. 7, 'n' number of columns (or bit lines) and 'm' number of rows (or word lines) are shown coupled to magnetic memory arrays with 'n' and 'm' being integer values. Magnetic memory elements are represented by a resistor symbol to indicate the resistive behavior thereof. It is understood that magnetic memory elements discussed herein behave like variable resistors with their resistances changing depending upon the orientation of the two magnetic layers of the MTJ thereof. The orientation of the free layer is set by the direction of the write current flowing through the magnetic memory. Each magnetic memory element is shown coupled to its corresponding access transistor, which serves to select the memory element. For example, the magnetic memory element 356, which is analogous to the memory element 100, is shown coupled to access transistor 358, which is analogous to the transistor 222. The access transistor 358 serves to select the memory element 356. A column decoder 400 is shown coupled to a group of bit line select transistors (or decoders) 360, which in this case is 'n' number of transistors. In an exemplary embodiment, the group of transistors 360 includes the transistors 214 and 216. Each of the transistors of the group of transistors 360 serves to select or activate the bit line to which it is coupled when it is activated by the column decoder 400. The input of the column decoder 400 is a part of the memory address provided to the array 320 to select a particular memory element to be written or read. The remainder of the address is provided to the row decoder 402, which selects one of the 'm' number of word lines. The part of the address that is coupled to the column decoder and includes a write enable indicative of the start of a write operation is referred to as 'write enable/address 404.

As earlier noted, the row decoder 402 receives the remainder of the address to the array 320 and based thereupon, activates a word line among the 'm' number of word lines. The activation of a particular word line and a particular bit line serve to select a memory element within the array 320 to be written to or read. The column decoder 400 and the row decoder 402 collectively decode the received address, accordingly activating a particular word line and bit line and thereby selecting a magnetic memory element to be written to or read.

Ver or virtual ground is shown coupled between the source of an access transistor of a word line to the drain of an access transistor of a subsequent word line.

A read enable signal 324 initiates a read (or sensing) operation, which is performed as discussed herein using a reference magnetic memory element, as shown in FIG. 1. The data to be written during a write operation is introduced at node 322 and the write operation takes place as discussed herein with reference to FIG. 6. It is understood that the write circuitry and read circuitry, as shown and discussed herein are simplified in that in an actual design, provisions are made so that the write and read operation do not interfere with each other, as well known to those skilled in the art. Thus, the inverters 338, 340 and 336 are analogous to the inverters of FIG. 6.

In operation, to write to, for example, the memory element 356 current flows in the direction indicated by the arrows starting from the memory element 356, flowing through the transistor 358, through Ver, and back up to the transistor 354 because the word line 332 are active to choose the memory element 356, as would the column 328 be active. The current flows through the transistor 354 back down to Ver and all the way down to the transistor 52 and to the transistor 54.

It is contemplated that the various embodiments of the present invention, such as those of FIGS. 1-7, have a variety of applications. For example, they may be used to replace hard disk drives as storage although, currently the costs may not justify such a substitute but in the future, as costs of memory elements such as those of the present invention decrease, it is anticipated that such a replacement will be practical. Alternatively, they may replace DRAM or other types of dynamic and even static memory and/or other types of memory currently in use. Another application of the various embodiments of the present invention includes the replacement of flash with the advantage that, for example, the memory elements of the embodiments of the present invention can withstand far more programming/writing thereto than the life span experienced by flash cells. The scalability of the embodiments of the present invention allow the same to replace many types of memory or storage devices.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

The invention claimed is:

1. A reference magnetic memory element employed for reading to a magnetic memory element comprising:
 a first magnetic tunnel junction (MTJ);
 a second MTJ coupled in parallel to the first MTJ;
 a third MTJ; and
 a fourth MTJ coupled in parallel to the first MTJ, said first and third MTJs coupled together in series and said second and fourth MTJs coupled together in series,
 wherein the first, second, third and fourth MTJs initially each have a resistance value of $R_{low}$;
 the reference magnetic memory element further including a formatting circuit coupled, at an output, to the second MTJ and to the fourth MTJ at a node, said first and second MTJs being coupled to a control gate of the formatting circuit and to a bit line, wherein the formatting circuit is operative to pump programming current through the first and second MTJs thereby changing their resistance values to $R_{high}$, the third and fourth MTJs being coupled at ends opposite to a respective end that is coupled to the formatting circuit, to a source of an access transistor, a gate of the access transistor being coupled to a word line and a drain of the access transistor being coupled to virtual ground,
 wherein activation of the formatting circuit causes programming of the first and second MTJs thereby increasing the resistance values of the first and second MTJs to $R_{high}$, the collective resistance value of the first and second MTJs being represented by the average of $R_{low}$ and $R_{high}$.

2. A magnetic memory sensing circuit comprising:
 a sense amplifier circuit having a first and a second node through which a magnetic memory element is to be read;
 a first current source coupled to the first node and operative to provide current;
 a second current source coupled to the second node and operative to provide current;
 a reference magnetic memory element having a resistance associated therewith and coupled to the first node, the reference magnetic memory element operative to receive current from the first current source;
 the magnetic memory element that is to be read, having a resistance associated therewith, coupled to the second node, the memory element operative to receive current from the second current source, current from the first current source and current from the second current source are the same;
 a transistor coupled to the second current source and to which a resistor is coupled, the transistor and the resistor operative to set the current value for the first current source and the second current source with the resistance value of the resistor determining the amount of current to be supplied by each the first and second current sources; and
 a formatting circuit having an output and a control gate, the formatting circuit coupled, through its output, to a first formatting magnetic memory element and a second formatting magnetic memory element at a third node and, through its control gate, to a third formatting magnetic memory element and a fourth formatting magnetic memory element, the first, second, third and fourth formatting magnetic memory elements each having a resistance associated therewith and defining a reference magnetic memory element, the formatting circuit being operable to provide programming current through the third and fourth formatting magnetic memory elements thereby changing the respective resistances of the third and fourth formatting magnetic memory elements to a resistance '$R_{high}$', $R_{high}$ being greater than a resistance $R_{low}$ and the average of $R_{high}$ and $R_{low}$ defining substantially an average resistance, the third and fourth formatting magnetic memory elements each being coupled to a source of an access transistor 18, a gate of the access transistor being coupled to a reference word line and a drain of the access transistor 18 being coupled to virtual ground, the third and fourth formatting magnetic memory elements being respectively coupled to a reference bit line, at nodes other than the third node, the formatting circuit operable to program the third and fourth formatting magnetic memory elements, under average conditions, thereby increasing the respective resistances of the third and fourth formatting magnetic memory elements to $R_{high}$ and the reference magnetic memory element having a substantially average resistance, wherein the logic state of the magnetic memory element is sensed by a comparison of the resistance of the memory element to the resistance of the reference magnetic memory element.

3. The magnetic memory sensing circuit, as recited in claim 2 including a criss-cross latch that is delayed in being activated.

4. The magnetic memory sensing circuit, as recited in claim 2 including a criss-cross latch that when activated causes an imbalance between the first and second nodes of the sense amplifier.

5. The magnetic memory sensing circuit, as recited in claim 2, wherein the at least one magnetic memory element is included in a memory array having a plurality of magnetic memory elements, each of the magnetic memory elements of the plurality of magnetic memory elements have corresponding access transistors, and having 'n' number of bit lines and 'm number of word lines, n and m being integer values, the bit lines being coupled to the magnetic memory elements and the word lines being coupled to the gate of the access transistors, the memory array further including a column decoder coupled to the bit lines, and a row decoder coupled to the word lines, the column decoder and the row decoder being operative to activate a particular word line and a particular bit line, the magnetic memory sensing circuit being operative to select a single one of the plurality of memory elements though a corresponding access transistor through the particular word line and the particular bit line.

6. The magnetic memory sensing circuit, as recited in claim 2 wherein the first current source is a first transistor and the second current source is a second transistor.

7. The magnetic memory sensing circuit, as recited in claim 6 wherein the first transistor has a first gate, a first drain and a first source and the second transistor has a second gate, a second drain and a second source and the drain of the first transistor is coupled to the first node and the drain of the second transistor is coupled to the second node and the gates of each of the first and second transistors are coupled to each other.

8. The magnetic memory sensing circuit, as recited in claim 2, wherein during a read operation, the sense amplifier compares the resistance of the at least one memory element to the resistance of the reference magnetic memory element, wherein at least two logic states are distinguished based on the resistance of one logic state being at least half of the resistance of that of another state.

* * * * *